United States Patent
Harada et al.

(12)

(10) Patent No.: US 6,434,068 B1
(45) Date of Patent: Aug. 13, 2002

(54) NONVOLATILE SEMICONDUCTOR MEMORY WITH TESTING CIRCUIT

(75) Inventors: Teruhiro Harada, Kanagawa; Keichiro Takeda, Tokyo, both of (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/956,124

(22) Filed: Sep. 20, 2001

(30) Foreign Application Priority Data

Aug. 10, 2000 (JP) ........................................ 2000-242151

(51) Int. Cl.$^7$ ............................. G11C 7/00; G11C 29/00
(52) U.S. Cl. ..................... 365/201; 365/207; 365/185.2; 365/185.21
(58) Field of Search .............................. 365/201, 185.2, 365/185.21, 207

(56) References Cited

U.S. PATENT DOCUMENTS

| | | | |
|---|---|---|---|
| 5,450,354 A | | 9/1995 | Sawada et al. |
| 5,517,448 A | | 5/1996 | Liu |
| 5,625,591 A | * | 4/1997 | Kato et al. ............... 365/201 X |
| 5,748,538 A | | 5/1998 | Lee et al. |
| 5,886,937 A | | 3/1999 | Jang |
| 5,889,702 A | * | 3/1999 | Gaultier et al. .......... 365/185.2 |

FOREIGN PATENT DOCUMENTS

| | | |
|---|---|---|
| JP | 61180999 A | 8/1986 |
| JP | 61181000 A | 8/1986 |
| JP | 02210694 A | 8/1990 |
| JP | 06-318683 | 11/1994 |

* cited by examiner

*Primary Examiner*—Huan Hoang
(74) *Attorney, Agent, or Firm*—Volentine Francos, PLLC

(57) ABSTRACT

A semiconductor memory circuit of the present invention comprises a word line, a bit line, a memory cell transistor having a first terminal applied to a first electrical potential, a second terminal connected to said bit line and a gate connected to the word line, a reference bit line, a reference cell transistor having a first terminal applied to the first electrical potential, a second terminal connected to the reference bit line and a gate connected to the word line, a sense node electrically connected to the bit line, a reference node electrically connected to the reference bit line, a differential amplifier having a first input connected to the sense node, a second input connected to the reference node and an output, a first load circuit connected between the sense node and a second potential source, a second load circuit connected between the reference node and the second potential source and a test circuit receiving a test signal. The first load circuit has a first resistance value. The second load circuit having a second resistance value that is lower than the first resistance value. The test circuit changes the first and second resistance values in response to the test signal.

20 Claims, 17 Drawing Sheets

OPERATING POINTS OF SENSE AMPLIFIER
AND REFERENCE CIRCUIT amp2

NONVOLATILE SEMICONDUCTOR MEMORY WITH TESTING CIRCUIT

BACKGROUND OF THE INVENTION

The present invention relates to a nonvolatile semiconductor memory and, more particularly, to a nonvolatile semiconductor memory equipped with a testing circuit.

Referring to FIG. 19, the descriptions will be given of the operation performed by a conventional nonvolatile semiconductor memory if, for example, a defect, such as a short circuit or the like between a word line and a bit line, has led to a leakage current (constant current) of a cell current level from a bit line BL to a ground line.

The axis of abscissa of the characteristic curve shown in FIG. 19 indicates a control gate voltage Vcg of a nonvolatile data storage memory cell (hereinafter referred to simply as "memory cell"), and the axis of ordinates indicates a drain current Ids of the memory cell. The descriptions will be given of a case where a power-supply voltage Vcc is employed as the control gate voltage Vcg.

Solid line (1) shown in FIG. 19 ideally indicates the drain current Ids of the memory cell in state "1", solid line (2) ideally indicates the drain current Ids of the memory cell in state "0", and dashed line (3) ideally indicates a judgement reference current, namely, the drain current Ids of a reference cell.

If a leakage current is generated, then solid line (1) shifts to solid line (1)', and solid line (2) shifts to solid line (2)'. A minimum operating voltage Vccmin and a maximum operating voltage Vccmax of data reading of the memory cell in state "0" will be an intersection "a" and an intersection "b", respectively, of dashed line (3) and solid line (2)'.

In a test mode, a testing word line is set to an H-level to select a testing cell row, and normal word lines are set to an L-level to set the remaining memory cells to non-selection. Stored data is read out of a testing cell to determine "1"/"0" of the data.

If the testing cell is in state "1," then a differential amplifier amp determines that the data is "1" on the basis of dashed line (3) indicating the judgment reference current, and outputs a voltage Vout of a level based on the determination result.

If the testing cell is in state "0," and if the control gate voltage Vcg is the X-coordinate or more of the intersection "b" of dashed line (3) and solid line (2)', or the X-coordinate or less of the intersection "a", then the differential amplifier determines that the data is "1" and outputs the voltage Vout of the level based on the determination result.

Thus, such a defect involving a leakage current that is present in a bit line can be detected by selecting the testing cell row in the test mode.

To detect a defect in which a threshold voltage Vt of a reference cell is higher than a predetermined value, data is written to the testing cell to set it to a state "0." Thereafter, the test mode is engaged, and a testing column decode signal and a word line are set to the H-level. By measuring a low-voltage operating voltage margin on a selected testing cell and the reference cell, it is possible to determine, on a cell in the state "0" whether the margin of the control gate voltage Vcg in a reading operation is insufficient.

As described above, a conventional one time programmable read-only memory (OTP) is equipped with a testing cell row and a reference column, and permits screening to be implemented for finding defective cells without the need for writing data to cells even after the OTP has been assembled.

The conventional OTP, however, has been equipped with a testing circuit unnecessary for normal operation for the testing cell row and the reference cell column. With the increasing trend toward further miniaturization of circuits typically represented by thinner wiring layers and smaller pitches between wires, the subdivision of bit lines and word lines are being enhanced. A testing cell has to be inserted on the basis of the minimum unit of divided memory cells. Therefore, the number of the testing cells is markedly increased, resulting in an increased proportion of a memory cell area in a total circuit area. This has been partly responsible for the difficulties in achieving a reduced scale of a completed device.

Furthermore, according to a conventional circuit configuration, it has been necessary to change the state "1"/"0" of a memory cell to carry out testing. This has been limiting the flexibility of a testing flow, and inevitably prolonging a test time because of the time required for writing data to a testing memory cell.

SUMMARY OF THE INVENTION

The present invention has been made with a view toward solving the problems described above. It is an object of the present invention to provide a nonvolatile semiconductor memory equipped with a testing circuit that permits the test of a current judgment memory cell and the leakage current screening on bit lines in a state wherein no data has been written.

A semiconductor memory circuit of the present invention comprises a word line, a bit line, a memory cell transistor having a first terminal applied to a first electrical potential, a second terminal connected to said bit line and a gate connected to the word line, a reference bit line, a reference cell transistor having a first terminal applied to the first electrical potential, a second terminal connected to the reference bit line and a gate connected to the word line, a sense node electrically connected to the bit line, a reference node electrically connected to the reference bit line, a differential amplifier having a first input connected to the sense node, a second input connected to the reference node and an output, a first load circuit connected between the sense node and a second potential source, a second load circuit connected between the reference node and the second potential source and a test circuit receiving a test signal. The first load circuit has a first resistance value. The second load circuit having a second resistance value that is lower than the first resistance value. The test circuit changes the first and second resistance values in response to the test signal.

DESCRIPTION OF THE PREFERRED EMBODIMENTS

Figure 1:
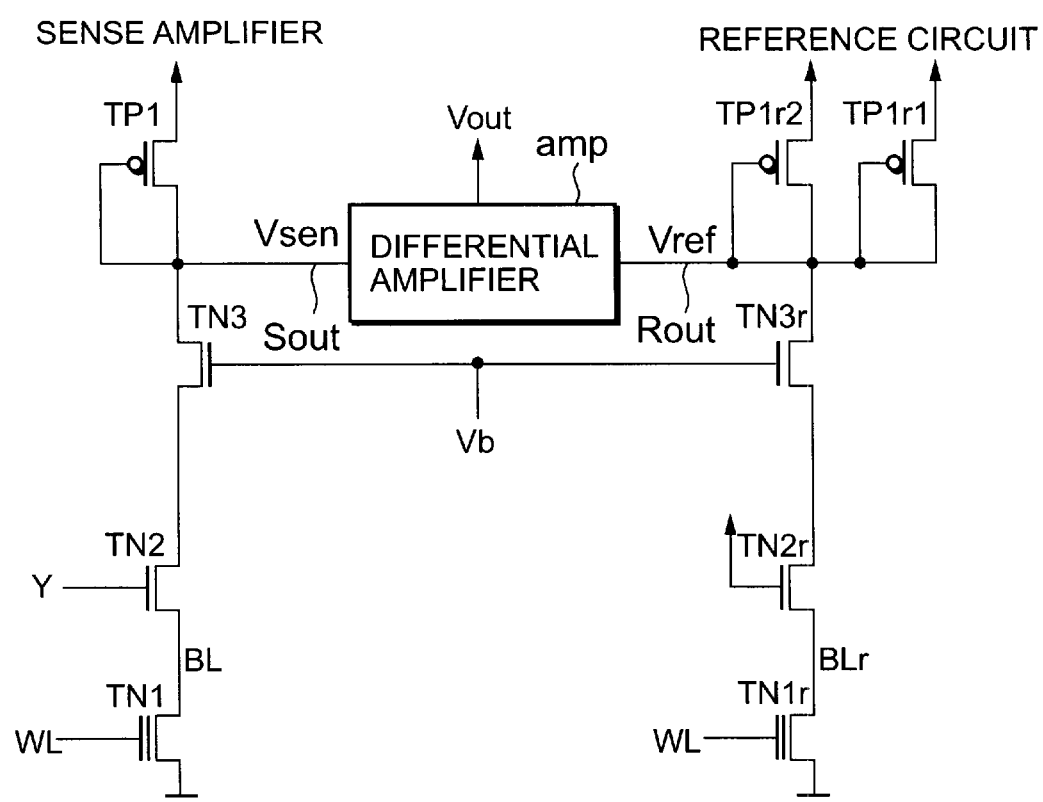
FIG. 1 is a circuit diagram showing a basic circuit configuration of a testing circuit according to first to fifth embodiments of the present invention.

With reference to the accompanying drawings, the preferred embodiments of the nonvolatile semiconductor memory with a testing circuit in accordance with the present invention will be described in detail. In the following descriptions and the accompanying drawings, the components having substantially the same functions and constituents will be assigned the same reference numerals, and the descriptions thereof will not be repeated.

Referring to FIG. 1 through FIG. 4, the descriptions will be given of the configuration and the operation of a basic circuit (hereinafter referred to as a "first basic circuit") of a nonvolatile semiconductor memory equipped with a testing circuit according to an embodiment of the present invention.

The nonvolatile semiconductor memory according to the embodiment of the present invention is provided with a plurality of memory cells (hereinafter referred to "cells") for storing data that are arranged in an array. For the purpose of explanation, only a selected cell TN1 (a first load circuit) is shown in FIG. 1. The cell TN1 is an n-channel MOS transistor having a floating gate, the control gate thereof being coupled to a word line WL, the drain thereof being coupled to a bit line BL, and a source thereof being coupled to a ground line.

A reference cell TN1r is provided to supply a judgment reference current, and is formed to be as large as the cell TN1. The control gate of the reference cell TN1r is coupled to a word line WL, the drain thereof is coupled to a reference bit line BLr, and the source thereof is coupled to a ground line.

The threshold voltage of the cell TN1 rises while data is being written; hence, it remains in an OFF state (or in a state wherein a drain current amount is small) even if the word line WL switches from L-level to H-level. On the other hand, the reference cell TN1r switches to an ON state when the word line WL is set at the H-level, because no data has been written thereto. Hereinafter, the state of a cell wherein no data has been written will be defined as "1," while the state of a cell wherein data has been written will be defined as "0."

A transistor TN2, which is turned ON/OFF by a column decode signal Y, functions as a column switch. A transistor TN2r constitutes a dummy circuit provided in correspondence to the transistor TN2.

A transistor TN3 having its gate subjected to a constant voltage Vb is provided to prevent erroneous data from being written to the cell TN1 due to a high voltage applied to a bit line BL. The voltage applied to the drain of the cell TN1 is limited to approximately 1 V by the transistor TN3, thus restraining the charging and discharging of a parasitic capacitor on the bit line BL, with a resultant higher current detection speed. A transistor TN3r constitutes a dummy circuit provided in correspondence to the transistor TN3.

A transistor TP1 constitutes a load circuit for converting the current passing through the cell TN1 into a sense amplifier output voltage Vsen and for outputting the sense amplifier output voltage Vsen to a sense amplifier output node Sout (a first input node of a differential amplifier). Transistors TP1r1 and TP1r2 constitute a load circuit (a second load circuit) for converting the current passing through the reference cell TN1r into a reference circuit output voltage Vref and for outputting the reference circuit output voltage Vref to a reference circuit output node Rout (a second input node of the differential amplifier).

In this case, the transistor TP1r1 and the transistor TP1r2 will be taken as a single virtual transistor TP1r, and an ON resistance of the transistor TP1r will be denoted as RTP1r. The transistor TP1 is formed so that its ON resistance RTP1 will be higher than an ON resistance RTP1r obtained from the transistor TP1r. Normally, the circuit will be configured so that a plurality of transistors of the same size as that of the transistor TP1 are provided in a reference circuit such that the ON resistance RTP1 will be double or triple the ON resistance RTP1r. In the first basic circuit shown in FIG. 1, two transistors TP1r1 and TP1r2 are provided in the reference circuit, and the ratio of the ON resistance RTP1 and the ON resistance RTP1r is set to be 2:1. The ON resistances of the transistors TR1, TP1r1, and TP1r that are diode-coupled are decided, considering the speed at which data is read out from the cell TN1 and the voltage consistency of the sense amplifier output voltage Vsen applied to the differential amplifier amp and the reference circuit output voltage Vref.

The differential amplifier amp is of a typical type. The transistor TP1 and the transistors TP1r1 and TP1r2 are connected to the sense amplifier and the reference circuit, respectively, in the same manner with respect to the differential amplifier amp. The differential amplifier amp receives the sense amplifier output voltage Vsen and the reference circuit output voltage Vref, amplifies the potential difference therebetween, and outputs the potential difference in the form of a voltage Vout. The current value (the judgement reference current value) of the reference cell TN1r that provides the standard for the differential amplifier amp to determine "1"/"0" agrees with RTPr/RTP1 (1/2 in this case).

The operation of the first basic circuit shown in FIG. 1 will now be described.

Figure 2:
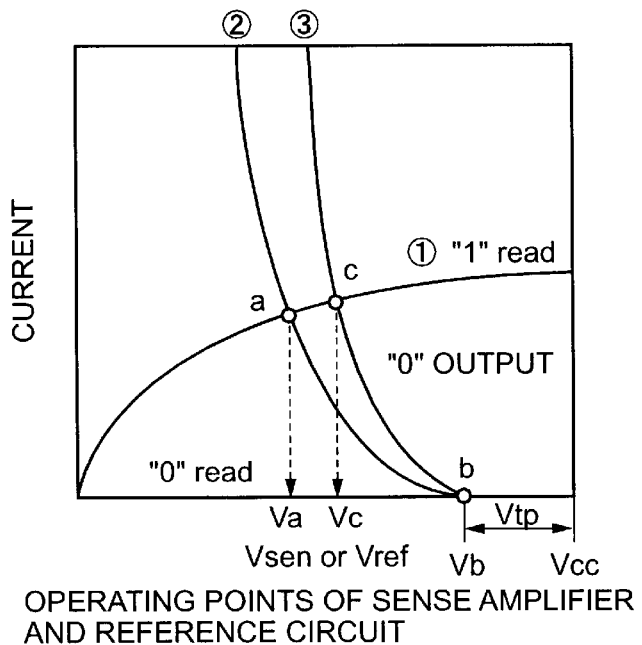
FIG. 2 is a characteristic curve diagram showing the static characteristics of the transistors making up the testing circuit shown in FIG. 1.

FIG. 2 shows the static characteristics of the transistor TN3 (the transistor TN3r), the transistor TP1, and the transistor TP1r. The axis of abscissa of the characteristic curve diagram shown in FIG. 2 indicates the sense amplifier output voltage Vsen or the reference circuit output voltage Vref, and the axis of ordinates indicates the currents passing through the transistors. Solid line (1) denotes the Vds-Ids (drain voltage-drain current) characteristic of the transistors TN3 and TN3r in a state wherein no data has been written to the transistor TN1 and the transistor TN1r, namely, the state denoted as "1". The Vds-Ids characteristic of the transistors TN3 and TN3r when data has been written to the transistor TN1, namely, in the state denoted as "0" will be represented by Ids=0, thus overlapping the axis of abscissa. Solid line (2) indicates the static characteristic of the transistor TP1, and solid line (3) indicates the static characteristics of the transistors TPr1 and TPr2. Reference characteristic Vtp denotes the threshold voltage of a p-type transistor.

The value of the current passing through the transistor TP1 is equal to the value of the current passing through the cell TN1. Hence, if the cell TN1 is in the state "1," then the sense amplifier output voltage Vsen is a voltage Va corresponding to the X-coordinate of the intersection "a" of solid line (1) and solid line (2), and Vb=Vtp corresponding to the X-coordinate of the intersection "b" of the axis of abscissa and solid line (2) if the cell TN1 is in the state "0". In other words, the sense amplifier output voltage Vsen takes a value ranging from the voltage Va to the voltage Vb according to the current passing through the cell TN1.

Meanwhile, the reference cell TN1r is always in the state "1", so that the reference circuit output voltage Vref is a voltage Vc corresponding to the X-coordinate of the intersection "c" of solid line (1) and solid line (3) that is the load curve of the transistor TP1r.

The differential amplifier amp amplifies the potential difference between the sense amplifier output voltage Vsen and the reference circuit output voltage Vref, and outputs the potential difference in the form of the output voltage Vout. The output voltage Vout indicates that the logic state of the cell TN1 is "1" or "0" according to the voltage level.

The operating voltage range of the cell TN1 and the reference cell TN1r defined by the relationship between the control gate voltage Vcg and the drain current Ids when the first basic circuit shown in FIG. 1 is used will now be described in conjunction with FIGS. 3 and 4. The descriptions will be given of a case where the power-supply voltage Vcc is used as the control gate voltage Vcg.

Figure 3:
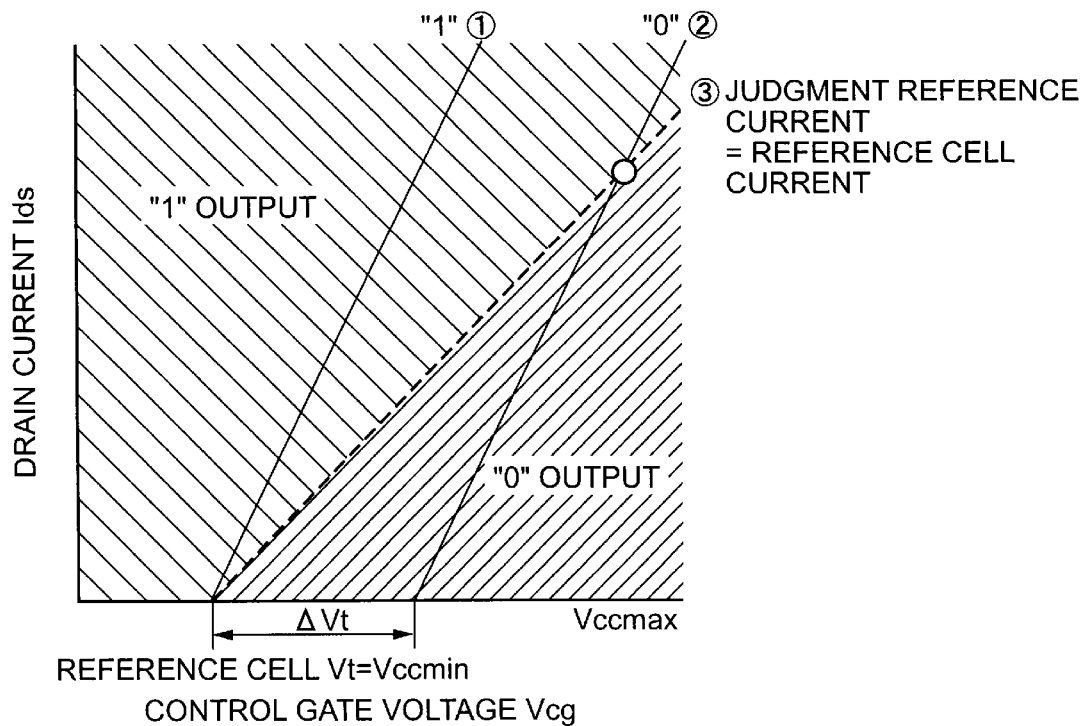
FIG. 3 is a characteristic curve diagram (part 1) showing the operating voltage range of a data storage memory cell and a reference cell provided in the testing circuit shown in FIG. 1.

The axis of abscissa in the characteristic curve diagram shown in FIG. 3 indicates the control gate voltage Vcg (the power-supply voltage Vcc in this case) of the cell TN1, and the axis of ordinates indicates the drain current Ids. Solid line (1) shown in FIG. 3 ideally indicates the drain current Ids of the cell TN1 in state "1", solid line (2) ideally indicates the drain current Ids of the cell TN1 in state "0", and dashed line (3) ideally indicates a judgement reference current, namely, the drain current Ids of a reference cell TN1r (1/2 of the drain current Ids of the cell TN1).

When data is read, the drain voltage of the cell TN1 is maintained at nearly a constant low voltage; therefore, the characteristics of the cell TN1 when the control gate voltage Vcg is equal to the power-supply voltage Vcc are collinearly approximated.

As is obvious from FIG. 3, a minimum operating voltage Vccmin for reading data from the cell TN1 in the state "1" is defined by the threshold voltage Vt (Vt1) of the cell TN1 in the state "1" wherein no data has been written. A minimum operating voltage Vccmin for reading data from the cell TN1 in the state "0" wherein data has been written is defined by the threshold voltage Vt of the reference cell TN1r.

A maximum operating voltage Vccmax is determined from the intersection of solid line (2) and dashed line (3). The maximum operating voltage Vccmax for reading data from the cell TN1 in the state "0" depends upon a threshold voltage Vt1, a shift ($\Delta$Vt) of the threshold voltage Vt that has changed by the written data, and the tilt of the judgment reference current (the reference current passing through the reference cell TNr1). For example, the maximum operating voltage Vccmax when the judgment reference current is set to the half of the current passing through the cell TN1 is obtained by Vt+2×$\Delta$Vt. The maximum operating voltage Vccmax for reading data from the cell TN1 in the state "1" is independent of the cell TN1.

Figure 4:
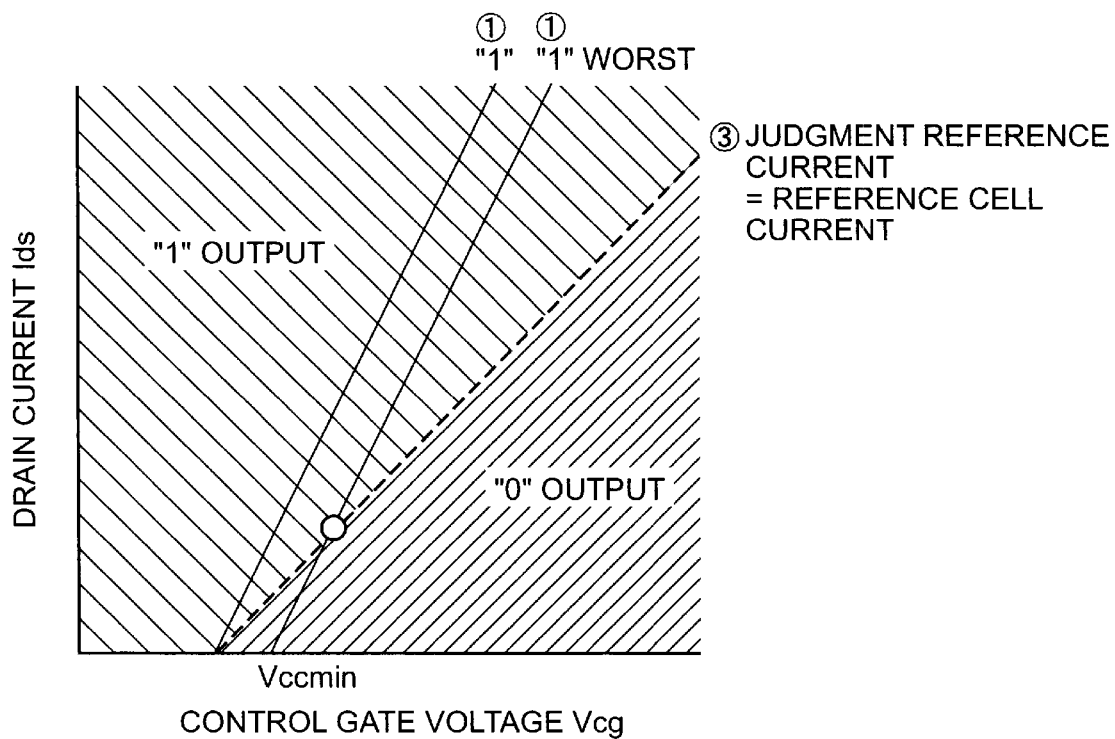
FIG. 4 is another characteristic curve diagram (part 2) showing the operating voltage range of the data storage memory cell and the reference cell provided in the testing circuit shown in FIG. 1.

If attention is focused only on an expected value "1" (an expectation in that data is read from the cell TN1 in the state "1" wherein no data has been written, and data "1" is obtained by the output voltage Vout), then the minimum operating voltage Vccmin is obtained from the intersection of solid line (1)', which indicates the characteristics of the cell TN1 in the case of a maximum deviation of the threshold voltage Vt from a reference value, and dashed line (3), as shown in FIG. 4.

Thus, according to the first basic circuit shown in FIG. 1, the amount of the current passing through the cell TN1 is determined by using the current passing through the reference cell TN1r, i.e., the judgment reference current, as the reference. However, an expected value "0" (an expectation in that data is read from the cell TN1 in the state "0" wherein data has been written, and data "0" is obtained by the output voltage Vout) depends. on the threshold voltage Vt of the reference cell TNr1. Hence, the measurement of the margin of the minimum operating voltage Vccmin for reading data from the cell TN1 wherein data has been written (the measurement includes the test of a current judgment memory cell and the screening for the leakage current in a bit line in a state wherein no data is written) cannot be performed unless data is written to the cell TN1 to set the cell TN1 to the state wherein it does not allow current to pass therethrough (theoretically, the current has to be reduced to a half or less of the current passing through the reference cell TN1r).

A case, for example, will be discussed where the first basic circuit shown in FIG. 1 is applied to a one time PROM (OTP). In general, after an OTP has been assembled, no data can be written to the cell TN1. More specifically, if the first basic circuit shown in FIG. 1 is directly applied to the OTP, then the margin of the minimum operating-voltage Vccmin on the expected value "0" cannot be measured after the OTP is assembled. This problem can be solved by the nonvolatile semiconductor memories according to the embodiments of the present invention, which will be described in detail.

FIRST EMBODIMENT

Figure 5:
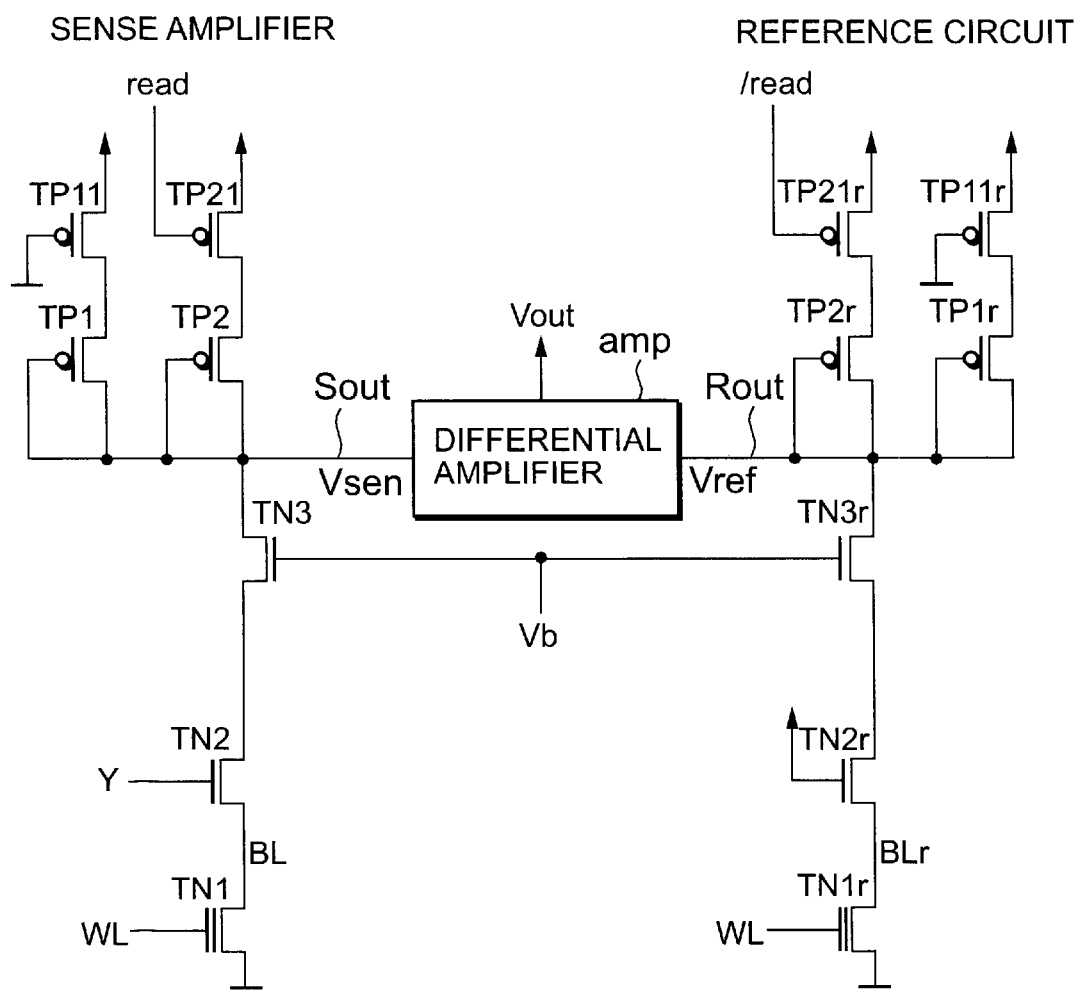
FIG. 5 is a circuit diagram of a testing circuit according to a first embodiment of the present invention.

The configuration of a testing circuit of a nonvolatile semiconductor memory according to a first embodiment of the present invention (hereinafter referred to as "the testing circuit") is shown in FIG. 5. In the testing circuit according to the first embodiment, p-type transistors TP2, TP21, and TP11 have been added to the sense amplifier, and p-type transistors TP11r and TP21r have been added to the reference circuit in the first basic circuit shown in FIG. 1.

The drain and the gate of the transistor TP1 provided in the sense amplifier are commonly coupled to a sense amplifier output node Sout. The source of the transistor TP1 is coupled to the drain of the transistor TP11.

The source of the transistor TP11 is coupled to a power-supply voltage Vcc line, and the gate thereof is coupled to a ground line.

The gate and the drain of the transistor TP2 are commonly coupled to the sense amplifier output node Sout. The source of the transistor TP2 is coupled to the drain of the transistor TP21.

The source of the transistor TP21 is coupled to the power-supply voltage Vcc line, and the gate thereof is coupled to the transmission line of a control signal "read".

The drain and the gate of a transistor TP1r provided in the reference circuit are commonly connected to a reference circuit output node Rout. The source of the transistor TP1r is coupled to the drain of the transistor TP11r.

The source of the transistor TP11r is coupled to the power-supply voltage Vcc line, and the gate thereof is coupled to a ground line.

The drain and the gate of a transistor TP2r are commonly connected to the reference circuit output node Rout. The source of the transistor TP2r is coupled to the drain of the transistor TP21r.

The source of the transistor TP21r is coupled to the power-supply voltage Vcc line, and the gate thereof is coupled to the transmission line of a control signal "/read".

The control signal "read" is a mode switching signal that switches to "H" in a normal mode wherein data is read, and to "L" in a test mode. The control signal "/read" is a logic-inverting signal of the control signal "read".

The transistors TP1, TP2, TP1r, and TP2r are formed to have the same size, and the transistors TP11, TP21, TP11r, and TP21r are also formed to have the same size.

Furthermore, in order to prevent a voltage drop from taking place in the sense amplifier output voltage Vsen and the reference circuit output voltage Vref, the transistors TP11, TP21, TP11r, and TP21r are configured to have ON resistances that are extremely lower than those of the transistors TP1, TP2, TP1r, and TP2r.

The operation of the testing circuit according to the first embodiment configured as described above will now be explained.

When data is read from the cell TN1, the control signal "read" switches to "H", while the control signal "/read" switches to "L"; therefore, the transistor TP21 turns OFF, while the transistor TP21r turns ON. The transistors TP11 and TP11r are always ON. The ON resistances of these transistors TP21r, TP11, and TP11r are extremely low, and do not affect the operation for reading data. Hence, the testing circuit according to the first embodiment shown in FIG. 5 will be circuit-wise equivalent to the first basic circuit shown in FIG. 1, and the data reading operation will be substantially the same as the operation of the first basic circuit that has been explained in conjunction with FIG. 2.

When the testing circuit according to the first embodiment is shifted to the test mode, the control signal "read" switches to "L", while the control signal "/read" switches to "H", causing the transistor TP21 to turn ON and the transistor TP21r to turn OFF.

Thus, the testing circuit according to the first embodiment switches between the load transistor configured on the sense amplifier side and the load transistor configured on the reference circuit side according to the switching between the normal mode wherein the data reading operation is performed and the test mode. In other words, the circuit configuration of the load transistor on the sense amplifier side in the normal mode wherein the data reading operation is performed coincides with the circuit configuration of the load transistor on the reference circuit side in the test mode, and the circuit configuration of the load transistor on the reference circuit side in the normal mode coincides with the circuit configuration of the load transistor on the sense amplifier side in the test mode.

The output characteristic of the testing circuit according to the first embodiment in the test mode is illustrated in FIG. 2. Solid line (1) denotes the Vds-Ids (drain voltage-drain current) characteristic of transistors TN3 and TN3r in a state wherein no data has been written to the transistor TN1 and the transistor TN1r, namely, the state denoted as "1". The Vds-Ids characteristic when data has been written to the transistor TN1, namely, in the state denoted as "0", will be represented by Ids=0, thus overlapping the axis of abscissa. Solid line (2) indicates the static characteristics of the transistors TP1r and TPr11r, and solid line (3) indicates the static characteristics of the transistors TP1 and TP11.

Figure 6:
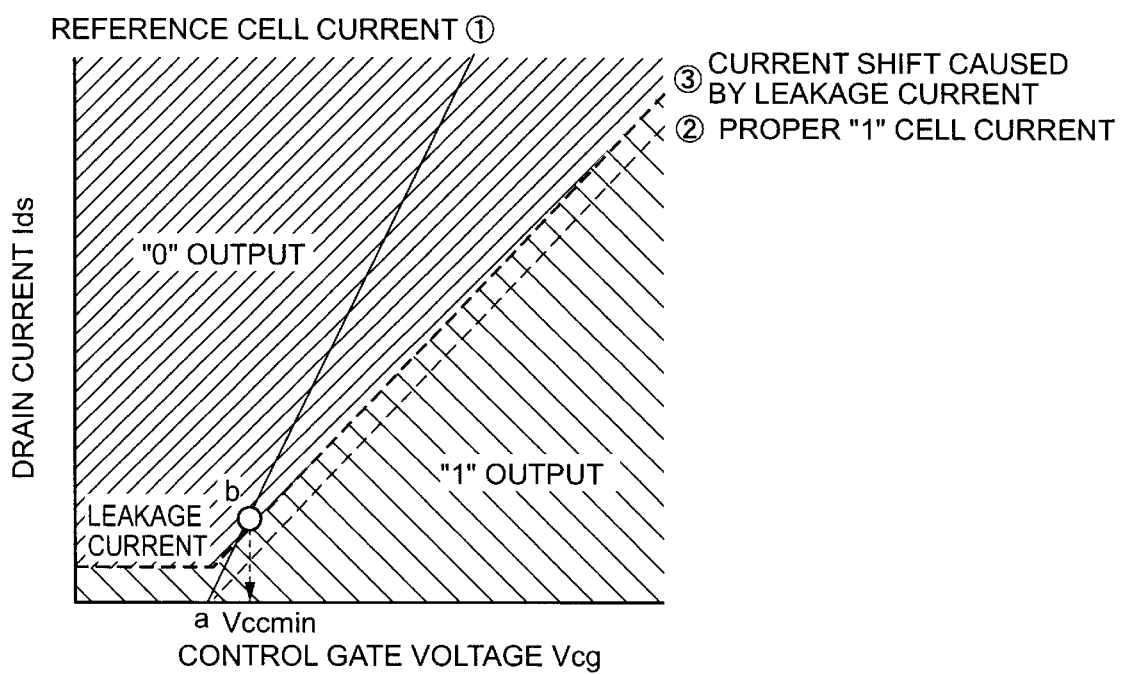
FIG. 6 is a characteristic curve diagram showing the operating voltage range in a test mode of a data storage memory cell and a reference cell provided in the testing circuit shown in FIG. 5.

The operation of the testing circuit according to the first embodiment in the test mode will now be described in conjunction with FIG. 6. Referring to FIG. 6, solid line (1) denotes the current passing through the reference cell TN1r, and dashed line (2) denotes the current passing through the cell TN1 (typical cell). If a leakage current is produced due to a fault of a bit line BL, then dashed line (2) shifts to dashed line (3) due to the leakage current. The minimum operating voltage Vccmin moves from the X-coordinate of an intersection "a" of solid line (1) and dashed line (2) at which current is passing normally through the bit line BL to the X-coordinate of an intersection "b" of solid line (1) and dashed line (3). Thus, the defect of the bit line BL is detected by the deterioration of the margin of the minimum operating voltage Vccmin.

As described above, in the testing circuit according to the first embodiment, the circuit configurations of the load transistor group on the sense amplifier side and the load transistor group on the reference circuit side are reversed according as whether the mode is the normal mode wherein the reading operation is performed or the test mode. This arrangement makes it possible to detect a defect (current leakage) of the bit line BL without the need for writing data to the cell TN1 for switching the state of the cell TN1.

The anomaly of the threshold voltage Vt of the reference cell TN1r is represented by the parallel shift of solid line (1) shown in FIG. 6 in the direction of the X-axis. In this case also, the intersection of solid line (1) and dashed line (2) indicates an operating limit. It is possible to detect a leakage current in a bit line by measuring the margin of the minimum operating voltage Vccmin.

SECOND EMBODIMENT

Figure 7:
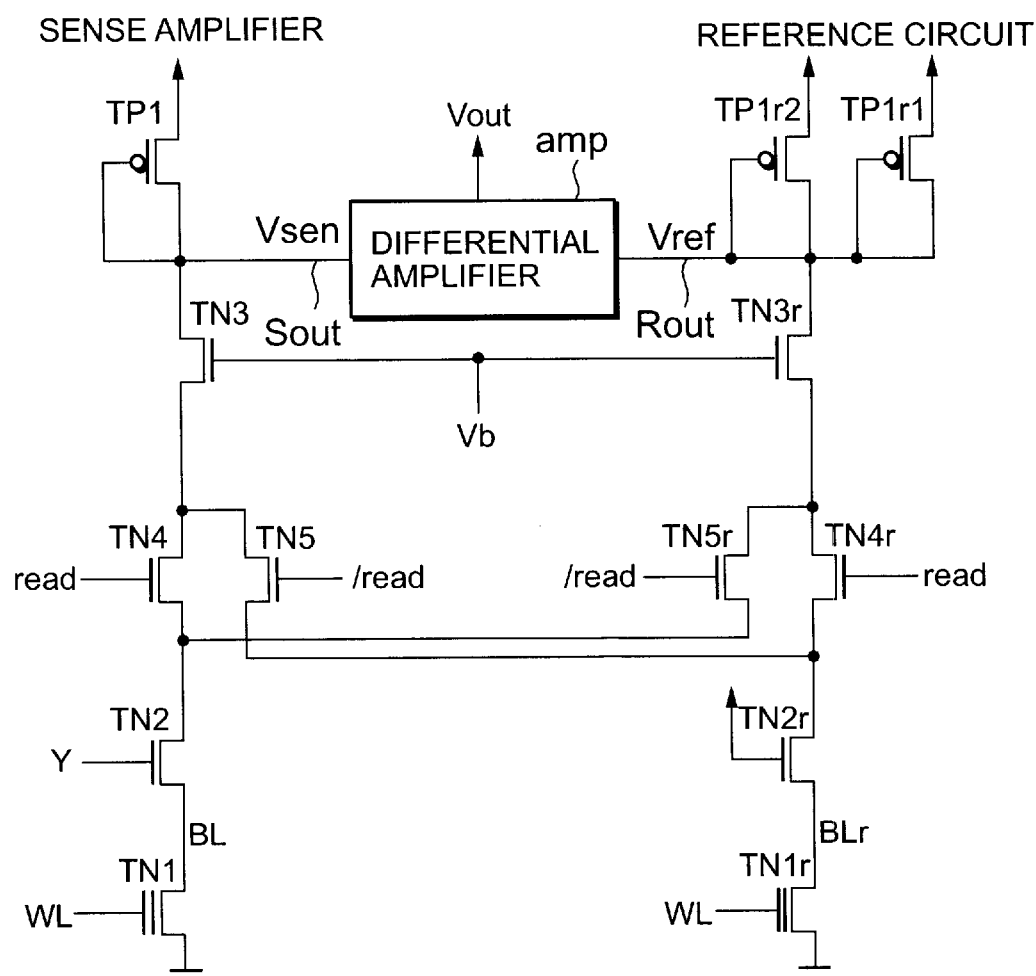
FIG. 7 is a circuit diagram of a testing circuit according to a second embodiment of the present invention.

The configuration of a testing circuit according to a second embodiment of the present invention is shown in FIG. 7. The testing circuit according to the second embodiment differs from the first basic circuit shown in FIG. 1 in that n-type transistors TN4 and TN5 have been added to the sense amplifier, and n-type transistors TN4r and TN5r have been added to the reference circuit.

The testing circuit according to the second embodiment and the first basic circuit share the same connection of transistors TP1, TP1r1, and TP1r2 acting as load transistors, and transistors TN3 and TN3r acting as low-voltage applying transistors. The testing circuit according to the second embodiment shares the same configuration as that of the first basic circuit from a transistor TN2 acting as a column switch and a dummy transistor TN2r thereof to a cell TN1 and a reference cell TN1r. Hence, the descriptions will be primarily given of a portion of the configuration of the testing circuit according to the second embodiment that is different from the first basic circuit.

The source of a transistor TN4 is coupled to the drain of the transistor TN2, and the drain thereof is coupled to the source of the transistor TN3. The gate of the transistor TN4 is coupled to the transmission line of a control signal "read". The control signal "read" is a mode switching signal that switches to "H" in a normal mode wherein data is read, and to "L" in a test mode.

The source of a transistor TN5 is coupled to the drain of the transistor TN2r, and the drain thereof is coupled to the source of the transistor TN3. The gate of a transistor TN5 is coupled to the transmission line of a control signal "/read", which is a logic-inverting signal of the control signal "read".

The transistor TN4r is a dummy transistor associated with the transistor TN4, and the source thereof is coupled to the drain of the transistor TN2r, and the drain thereof is coupled to the source of the transistor TN3r. The gate of the transistor TN4r is coupled to the transmission line of the control signal "read".

The transistor TN5r is a dummy transistor associated with the transistor TN5, and the source thereof is coupled to the drain of the transistor TN2, and the drain thereof is coupled to the source of the transistor TN3r. The gate of the transistor TN5r is coupled to the transmission line of the control signal "/read".

The sources of the transistor TN2 and the transistor TN2r are coupled to a bit line BL and a reference bit line BLr, respectively. The drains of the transistor TN3 and the transistor TN3r are coupled to a sense amplifier output node Sout and a reference circuit output node Rout, respectively.

These transistors TN4, TN4r, TN5, and TN5r are configured so as to have extremely low ON resistances for acting as switches; hence, their influences, such as a voltage drop, on a circuit operation are negligible.

The operation of the testing circuit according to the second embodiment constructed as described above will now be explained.

In the normal mode wherein data is read from the cell TN1, the control signal "read" is set at "H", while the control signal "/read" is set at "L"; therefore, the transistors TN4 and TN4r are turned ON, while the transistors TN5 and TN5r are turned OFF. Hence, the testing circuit according to the second embodiment in the normal mode will be circuit-wise equivalent to the first basic circuit shown in FIG. 1, and perform substantially the same operation as that of the first basic circuit that has been explained in conjunction with FIGS. 3 and 4.

In the test mode, the control signal "read" is set at "L", while the control signal "/read" is set at "H"; therefore, the transistors TN4 and TN4r are turned OFF, while the transistors TN5 and TN5r are turned ON. Thus, the configurations of the load transistor of the sense amplifier and the load transistor of the reference circuit are reversed, depending on whether the mode is the normal mode or the test mode. The operation of the testing circuit according to the second embodiment in the test mode will be the same as that of the testing circuit according to the first embodiment in the test mode.

As explained above, the testing circuit according to the second embodiment has not added any changes to the load transistor (transistor TN1) provided on the sense amplifier side, the load transistors (transistors TN1r1 and TN1r2) provided on the reference circuit side, the cell TN1, and the reference cell TN1r in the conventional testing circuit. The testing circuit according to the second embodiment is different from conventional testing circuit in that the transistors TN4, TN4r, TN5, and TN5r acting as the switches have been inserted between the load transistors and the cell TN1 and the reference cell TN1r. The operations of the inserted transistors cause the combination of the load transistor on the sense amplifier side, the load transistor on the reference circuit side, the cell TN1, and the reference cell TN1r to be reversed, depending upon whether the mode is the normal mode or the test mode. Hence, as in the case of the testing circuit according to the first embodiment, the testing circuit according to the second embodiment enables the detection of a leakage current in the bit line BL and the inspection of the reference cell TN1r to be carried out without the need for writing data to the cell TN1 to switch the state of the cell TN1.

THIRD EMBODIMENT

Figure 8:
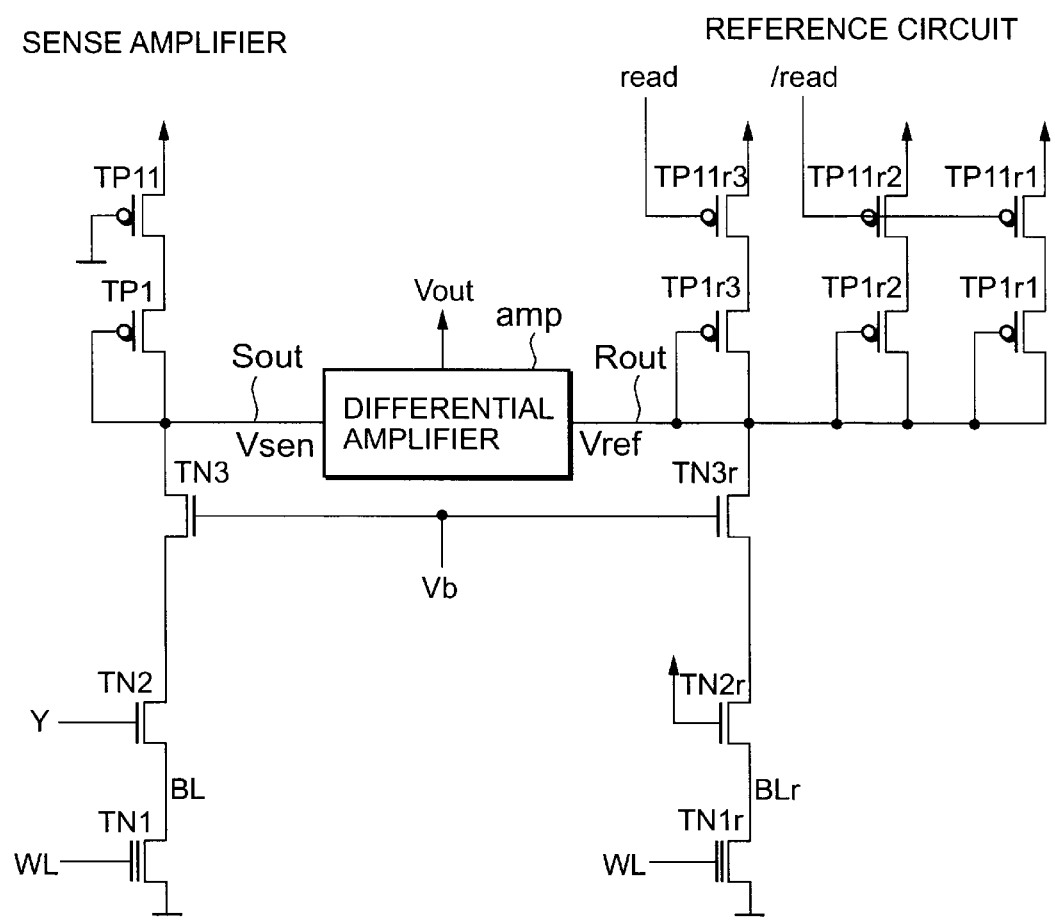
FIG. 8 is a circuit diagram of a testing circuit according to a third embodiment of the present invention.

The configuration of the testing circuit according to a third embodiment of the present invention is shown in FIG. 8. The testing circuit according to the third embodiment is different from the first basic circuit shown in FIG. 1 in that a p-type transistor TP11 has been added to the sense amplifier side, and p-type transistors TP11r1, TP11r2, TP1r3, and TP11r3 have been added to the reference circuit side.

The gate and the drain of a transistor TP1 provided in the sense amplifier are coupled to a sense amplifier output node Sout. The source of the transistor TP1 is coupled to the drain of the transistor TP11.

The source of the transistor TP11 is coupled to a power-supply voltage Vcc line, and the gate thereof is coupled to a ground line.

The gates and the drains of transistors TP1r1 and TP1r2 provided in the reference circuit are coupled to a reference circuit output node Rout. The sources of the transistors TP1r1 and TP1r2 are coupled to the drains of transistors TP11r1 and TP11r2, respectively.

The sources of the transistors TP11r1 and TP11r2 are coupled to the power-supply voltage Vcc line, and the gates thereof are coupled to the transmission line of the control signal "/read". It is possible to replace the transistor TP11r1 and the transistor TP11r2 by a single transistor.

The gate and the drain of a transistor TP1r3 are coupled to a reference circuit output node Rout. The source of the transistor TP1r3 is coupled to the drain of the transistor TP11r3.

The source of the transistor TP11r3 is coupled to the power-supply voltage Vcc line, and the gate thereof is coupled to the transmission line of the control signal "read".

The control signal "read" is a mode switching signal that switches to "H" in a normal mode wherein data is read, and to "L" in a test mode. The control signal "/read" is a logic-inverting signal of the control signal "read".

The transistors TP1, TP1r1, and TP1r2 are formed to have the same size, and the transistors TP11, TP11r1, TP11r2, and TP11r3 are also formed to have the same size. The transistor TP1r3 is formed to have an ON resistance that is double the ON resistance of the transistor TP1.

These transistors TP11, TP11r1, TP11r2, and TP11r3 are configured so as to have extremely low ON resistances for acting as switches; hence, their influences, such as a voltage drop, on a circuit operation are negligible.

The operation of the testing circuit according to the third embodiment constructed as described above will now be explained.

In the normal mode wherein data is read from the cell TN1, the control signal "read" is set at "H", while the control signal "/read" is set at "L"; therefore, the transistors TP11r1 and TP11r2 are turned ON, while the transistor TP11r3 is turned OFF. Hence, the testing circuit according to the third embodiment in the normal mode will be circuit-wise equivalent to the first basic circuit shown in FIG. 1, and perform substantially the same operation as that of the first basic circuit that has been explained in conjunction with FIG. 2.

In the test mode, the control signal "read" is set at "L", while the control signal "/read" is set at "H"; therefore, the transistors TP11r1 and TP11r2 are turned OFF, while the transistor TP11r3 is turned ON. As a result, the ON resistance of the load transistor on the reference circuit side in the test mode will be double that in the normal mode.

The output characteristics of the testing circuit according to the third embodiment in the test mode are illustrated in FIG. 2. Solid line (1) denotes the Vds-Ids (drain voltage-drain current) characteristic of the transistors TN3 and TN3r in a state wherein no data has been written to the transistor TN1 and the transistor TN1r, namely, the state denoted as "1". The Vds-Ids characteristic of the transistors TN3 and TN3r when data has been written to the transistor TN1, namely, in the state denoted as "0" will be represented by Ids=0, thus overlapping the axis of abscissa. Solid line (2) indicates the static characteristic of the transistor TP1r3, and solid line (3) indicates the static characteristic of the transistor TP1.

Figure 9:
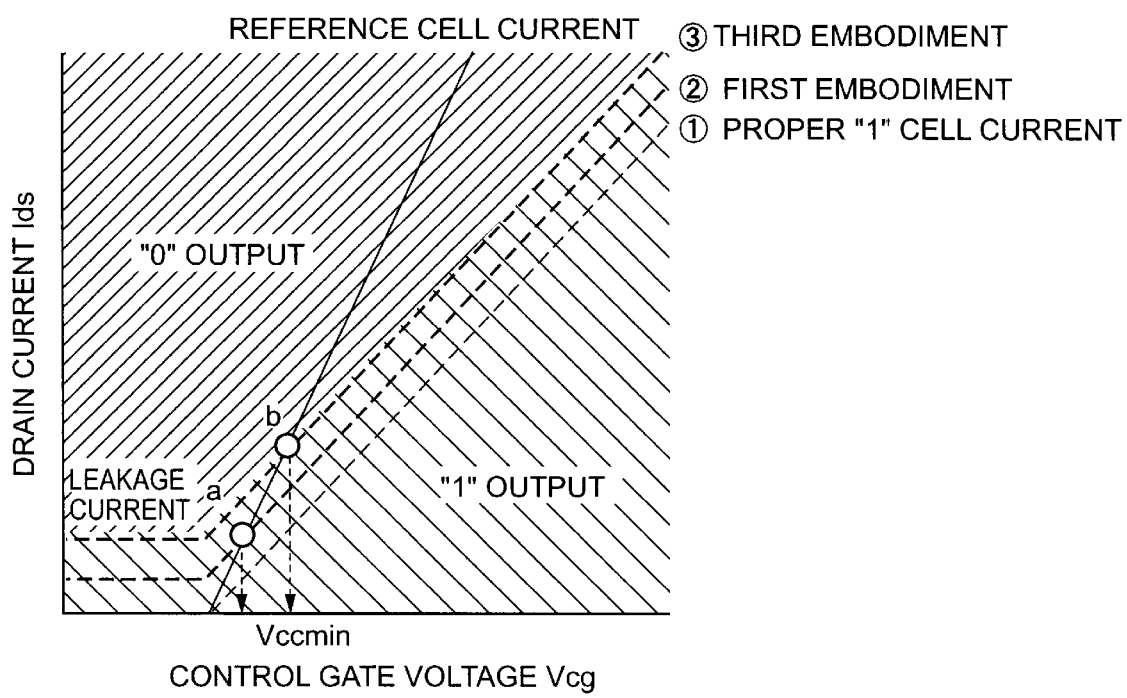
FIG. 9 is a characteristic curve diagram showing the operating voltage range in a test mode of a data storage memory cell and a reference cell provided in the testing circuit shown in FIG. 8.

The operation of the testing circuit according to the third embodiment in the test mode will now be described in conjunction with FIG. 9. Referring to FIG. 9, the solid line denotes the current passing through the reference cell TN1r, and dashed line (1) denotes the current passing through the cell TN1 (typical cell). If a leakage current is produced due to a fault of a bit line BL, then dashed line (1) shifts to dashed line (2) in the testing circuit according to the first embodiment. In the testing circuit according to the third embodiment, the configuration of the load transistor of the sense amplifier in the test mode remains the same as that in the normal mode; hence, the sensitivity of the detection of a leakage current remains the same in the test mode and the normal mode.

On the basis of the load transistors, in the testing circuit according to the first embodiment, the amount of a leakage current detected in the test mode will be the half of the leakage current in the normal mode. In the testing circuit according to the third embodiment, the amount of a leakage current detected in the test mode coincides with the amount of the leakage current in the normal mode. Therefore, when the testing circuit according to the third embodiment, the current passing through the cell TN1 in the case of a leakage current occurring in the bit line BL is represented by dashed line (3). A minimum operating voltage Vccmin moves from the X-coordinate of an intersection "a" of the solid line and dashed line (2) (the testing circuits according to the first and second embodiments) to the X-coordinate of an intersection "b" of the solid line and dashed line (3)(the third embodiment).

As discussed above, in the testing circuit according to the third embodiment, the configuration of the load transistor of the sense amplifier remains the same in the normal mode and the test mode. With this arrangement, the bit line BL can be inspected for a defect without loss of the sensitivity for detecting leakage current.

FOURTH EMBODIMENT

Figure 10:
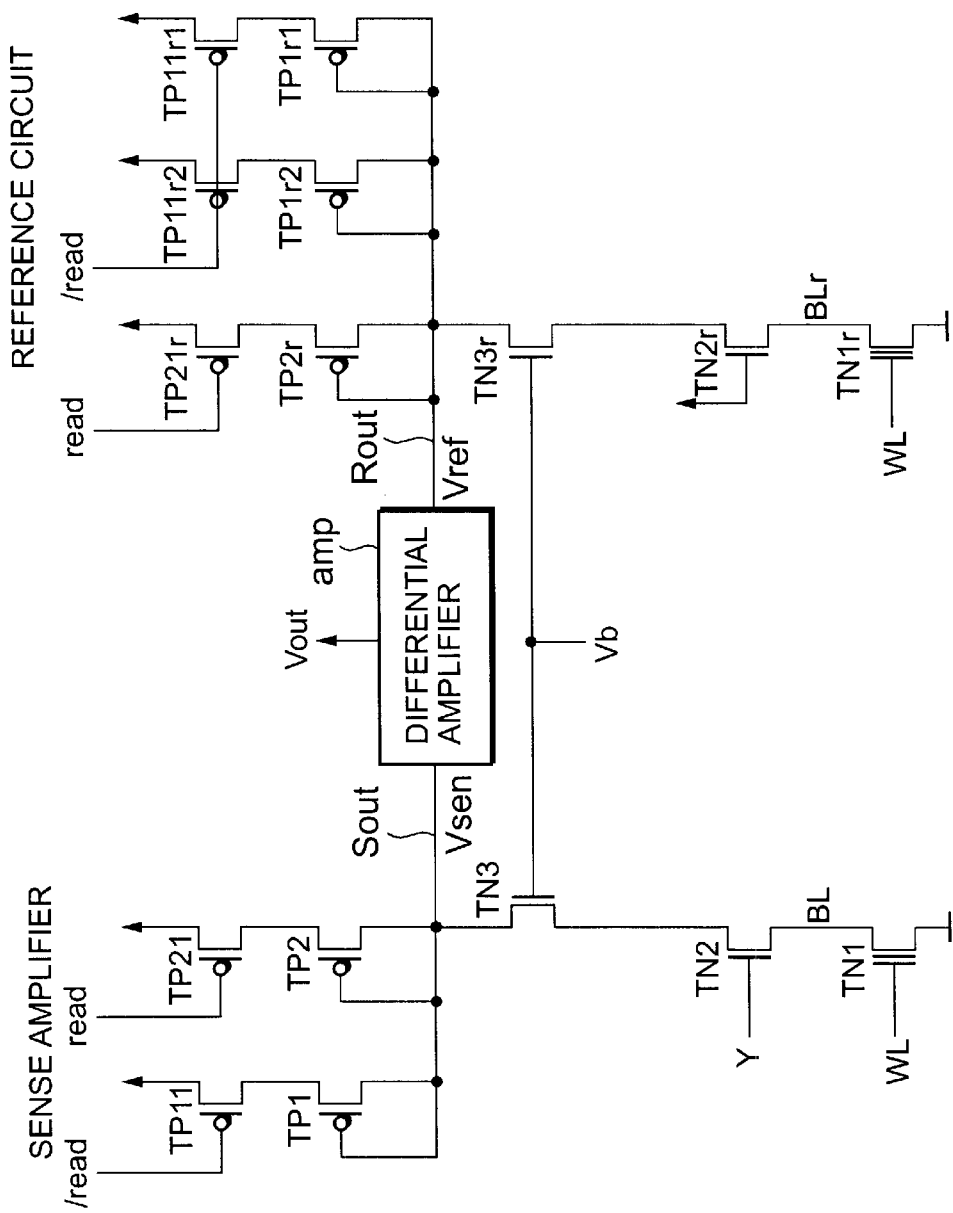
FIG. 10 is a circuit diagram of a testing circuit according to a fourth embodiment of the present invention.

The configuration of the testing circuit according to a fourth embodiment of the present invention is shown in FIG. 10. The testing circuit according to the fourth embodiment is different from the first basic circuit shown in FIG. 1 in that p-type transistors TP11, TP2, and TP21 have been added to the sense amplifier side, and p-type transistors TP11r1, TP11r2, TP2r, and TP21r have been added to the reference circuit side.

The gate and the drain of a transistor TP1 provided in the sense amplifier are coupled to a sense amplifier output node Sout. The source of the transistor TP1 is coupled to the drain of the transistor TP11.

The source of the transistor TP11 is coupled to a power-supply voltage Vcc line, and the gate thereof is coupled to the transmission line of a control signal "/read".

The gate and the drain of a transistor TP2 are coupled to a sense amplifier output node Sout. The source of the TP2 is coupled to the drain of a transistor TP21.

The source of the transistor TP21 is coupled to a power-supply voltage Vcc line, and the gate thereof is coupled to the transmission line of a control signal "read".

The gate and the drain of the transistors TP1r1 and TP1r provided in a reference circuit are coupled to a reference circuit output node Rout. The sources of the transistors TP1r1 and TP1r are coupled to the drains of transistors TP11r1 and TP11r2, respectively.

The sources of the transistors TP11r1 and TP11r2 are coupled to the power-supply voltage Vcc line, and the gates thereof are coupled to the transmission line of the control signal "/read". It is possible to replace the transistor TP11r1 and the transistor TP11r2 by a single transistor.

The gate and the drain of a transistor TP2r are coupled to a reference circuit output node Rout. The source of the transistor TP2r is coupled to the drain of the transistor TP21r.

The source of the transistor TP21r is coupled to the power-supply voltage Vcc line, and the gate thereof is coupled to the transmission line of the control signal "read".

The control signal "read" is a mode switching signal that switches to "H" in a normal mode wherein data is read, and to "L" in a test mode. The control signal "/read" is a logic-inverting signal of the control signal "read".

The transistors TP11, TP21, TP11r1, TP11r2, and TP21r are configured so as to have extremely low ON resistances for acting as switches; hence, their influences, such as a voltage drop, on a circuit operation are negligible.

The transistor TP2 and the transistor TP2r that turn ON in the test mode are formed so as to provide a relationship represented as RTP2<RTP2r when the ON resistance of the transistor TP2 is denoted as RTP2 and the ON resistance of the transistor TP2r is denoted as RTP2r.

The operation of the testing circuit according to the fourth embodiment constructed as described above will now be explained.

In the normal mode wherein data is read from the cell TN1, the control signal "read" is set at "H", while the control signal "/read" is set at "L"; therefore, the transistors TP11, TP11r1, and TP11r2 are turned ON, while the transistors TP21 and TP21r are turned OFF. Hence, the testing circuit according to the fourth embodiment in the normal mode will be circuit-wise equivalent to the first basic circuit shown in FIG. 1, and perform substantially the same operation as that of the first basic circuit that has been explained in conjunction with FIG. 2.

In the test mode, the control signal "read" is set at "L", while the control signal "/read" is set at "H"; therefore, the transistors TP11, TP11r1, and TP11r2 are turned OFF, while the transistors TP21 and TP21r are turned ON. At this time, the operation of the testing circuit according to the fourth embodiment will be substantially the same as the operation of the testing circuit according to the third embodiment that has been described in conjunction with FIG. 9.

The testing circuit according to the fourth embodiment is equipped with a load transistor that is enabled in the normal mode and a load transistor that is enabled in the test mode. In the test mode, current-to-voltage conversion is performed on the basis of the size of a testing load transistor (a transistor Tr2r) that decides the load on the reference circuit. As the ON resistance of the load transistor increases, the defect current based on the ON resistance of the load transistor increases. Hence, the testing circuit according to the fourth embodiment makes it possible to improve the sensitivity for detecting a leakage current in the bit line BL.

FIFTH EMBODIMENT

Figure 11:
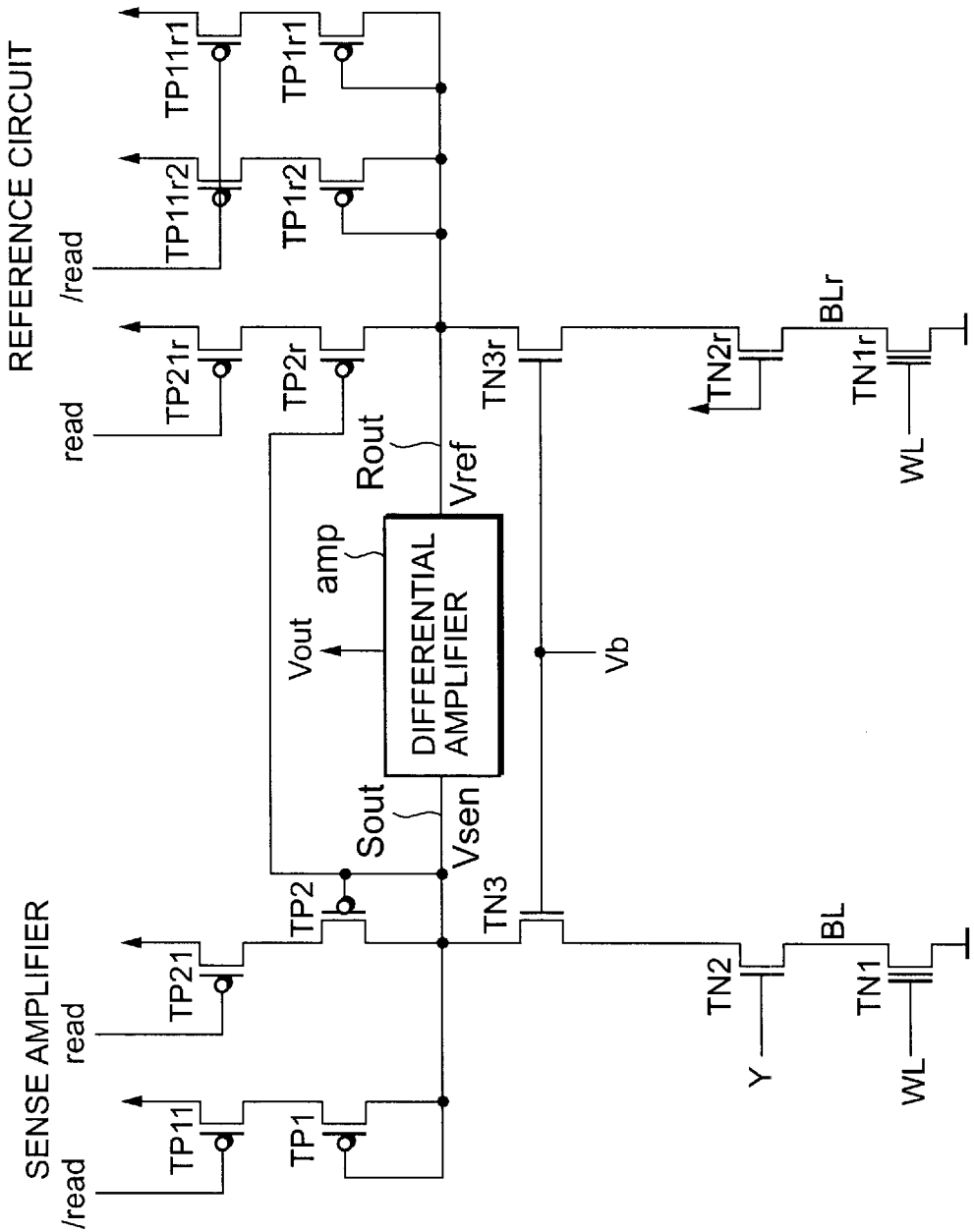
FIG. 11 is a circuit diagram of a testing circuit according to a fifth embodiment of the present invention.

The configuration of the testing circuit according to a fifth embodiment of the present invention is shown in FIG. 11. The testing circuit according to the fifth embodiment is different from the testing circuit according to the fourth embodiment in that the gate of a transistor TP2r provided on the reference circuit side is coupled to the sense amplifier output node Sout rather than the reference circuit output node Rout.

The control signal "read" is a mode switching signal that switches to "H" in a normal mode wherein data is read, and to "L" in a test mode. The control signal "/read" is a logic-inverting signal of the control signal "read".

The transistors TP11, TP21, TP11r1, TP11r2, and TP21r are configured so as to have extremely low ON resistances for acting as switches; hence, their influences, such as a voltage drop, on a circuit operation are negligible.

The transistor TP2 and the transistor TP2r that turn ON in the test mode are formed so as to provide a relationship represented as RTP2<RTP2r when the ON resistance of the transistor TP2 is denoted as RTP2 and the ON resistance of the transistor TP2r is denoted as RTP2r.

The operation of the testing circuit according to the fifth embodiment constructed as described above will now be explained.

In the normal mode wherein data is read from the cell TN1, the control signal "read" is set at "H", while the control signal "/read" is set at "L"; therefore, the transistors TP11, TP11r1, and TP11r2 are turned ON, while the transistors TP21 and TP21r are turned OFF. Hence, the testing circuit according to the fifth embodiment in the normal mode will be circuit-wise equivalent to the first basic circuit shown in FIG. 1, and perform substantially the same operation as that of the first basic circuit that has been explained in conjunction with FIG. 2.

In the test mode, the control signal "read" is set at "L", while the control signal "/read" is set at "H"; therefore, the transistors TP11, TP11r1, and TP11r2 are turned OFF, while the transistors TP21 and TP21r are turned ON. At this time, the voltage between the source and the gate of the transistor TP2 becomes equal to that of the transistor TP2r, causing a constant current of a small difference in ON resistance between the transistor TP2 and the transistor TP2r to pass through the reference circuit with respect to the current passing through the sense amplifier. The slight difference between the current passing through the cell TN1 and the current passing through the reference cell TN1r is voltage-amplified with high sensitivity, and the result appears, in the form of a reference circuit output voltage Vref, at the reference circuit output node Rout.

As described above, in the testing circuit according to the fifth embodiment, the two load transistors, namely, the transistor TN2 and TN2r, that are enabled in the test mode are connected to form a current mirror circuit. This arrangement increases the amplification factor of the difference between the current passing through the cell TN1 and the current passing through the reference cell TN1r. Thus, the sensitivity for detecting a leakage current in the bit line BL will be considerably improved.

The descriptions have been given of the testing circuits according to the first through fifth embodiments. So far, the examples have been described in the form of the first through fifth embodiments wherein the present invention has been applied to the testing circuits equipped with single-end type sense amplifiers. The present invention can, however, be applied also to a testing circuit equipped with a constant-voltage-applied sense amplifier (hereinafter referred to as the "constant-voltage sense amplifier") to which a cell current is supplied and the amount of the current is detected.

Figure 12:
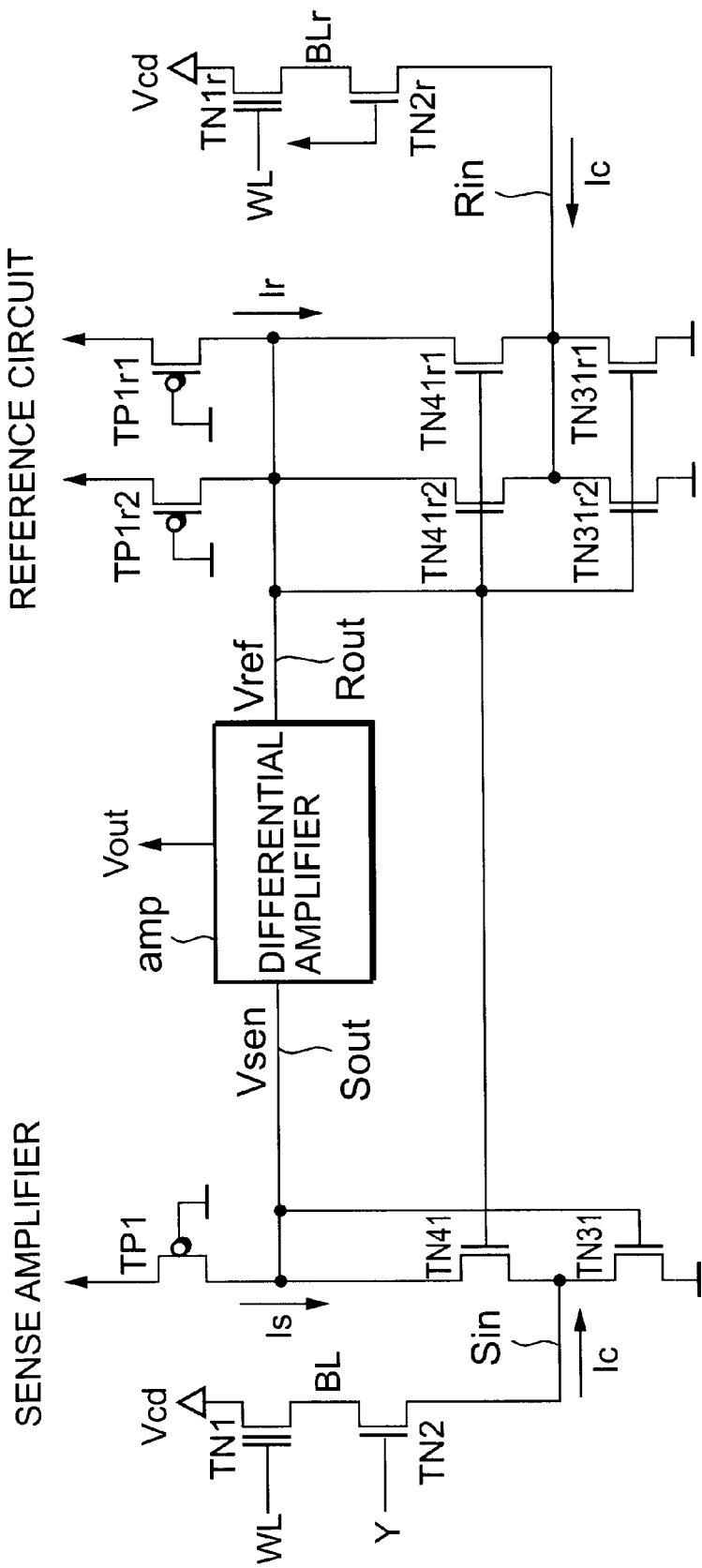
FIG. 12 is a circuit diagram showing a basic circuit configuration of a testing circuit according to sixth to ninth embodiments of the present invention.

Referring now to FIG. 12, the basic circuit (hereinafter referred to as a "second basic circuit") of a testing circuit equipped with a constant-voltage sense amplifier according to an embodiment of the present invention.

FIG. 12 shows a cell TN1 and a transistor TN2 acting as a column switch, with a simplified view of a memory cell and its peripheral decoder. The drain of the cell TN1 is coupled to a low-voltage power source Vcd line, and the source thereof is coupled to a bit line BL.

A reference cell TN1r is provided to obtain a judgment reference current, and is formed to share the same size as that of the cell TN1. The drain of the reference cell TN1r is coupled to the low-voltage power source Vcd line, and the source thereof is coupled to a reference bit line BL.

The current flows from the sense amplifier to the cell TN1 in the first basic circuit shown in FIG. 1, whereas the current flows from the cell TN1 to the sense amplifier in the second basic circuit.

The transistor TN2 functions as a column switch, as mentioned above. The transistor TN2r is a dummy circuit provided in correspondence to the transistor TN2.

A sense amplifier section for detecting the current passing through the cell TN1 is constructed by a sense amplifier (a first current detecting circuit), a reference circuit (a third current detecting circuit), and a differential amplifier amp.

The sense amplifier is constructed by transistors TN31, TN41, and TP1.

The drain, the source, and the gate of the transistor TN31 are coupled to a sense amplifier input node Sin, a ground line, and a sense amplifier output node Sout, respectively.

The drain, the source, and the gate of the transistor TN41 are coupled to a sense amplifier output node Sout, the sense amplifier input node Sin, and a reference circuit output node Rout, respectively.

The drain, the source, and the gate of the transistor TN1 are coupled to a sense amplifier output node Sout, a power-supply voltage Vcc line, and a ground line, respectively.

The reference circuit is constructed by transistors TN31r1, TN31r2, TN41r1, TN41r2, TP1r1, and TP1r2.

The drains, the sources, and the gates of the transistors TN31r1 and TN31r2 are coupled to the reference circuit input node Rin, a ground line, and the reference circuit output node Rout, respectively.

The drains, the sources, and the gates of the transistors TN41r1 and TN41r2 are coupled to the reference circuit output node Rout, the reference circuit input node Rin, and the reference circuit output node Rout, respectively.

The drains, the sources, and the gates of the transistors TP1r1 and TN1r2 are coupled to the reference circuit output node Rout, the power-supply voltage Vcc line, and a ground line, respectively.

The transistors: TP1, TP1r1, and TP1r2 are formed to share the same size. Similarly, the transistors TN31, TN31r1, and TN31r2 are formed to share the same size, and the transistors TN41, TN41r1, and TN41r2 are formed to share the same size. Thus, by setting the sizes of the transistors, the ratio of a sense amplifier current Is and a reference circuit current Ir is set to 1:2.

The differential amplifier amp, which employs a standard differential amplifier, receives a sense amplifier output voltage Vsen and a reference circuit output voltage Vref, amplifies the potential difference therebetween, and outputs the amplified potential difference in the form of a voltage Vout.

The operation of the second basic circuit will now be described by using formulas. In the second basic circuit, the gates of the transistors TP1, TP1r1, and TP1r are connected to the ground lines. In actual operation, the sense amplifier current Is and the reference circuit current Ir vary according to the changes in the potential at the sense amplifier output node Sout and the changes in the potential at the reference circuit output node Rout, respectively. However, the changes in the sense amplifier current Is and the reference circuit current Ir are so small that they can be ignored in considering the sensing operation. Therefore, for the purpose of simplifying the descriptions, it will be assumed that the sense amplifier current Is and the reference circuit current Ir remain at constant levels. The value of the current passing through the memory cells, namely, the cell TN1 and the reference cell TN1r, will be denoted as Ic, and the ON resistances of the transistors TN31, TN31r1, and TN31r will be denoted as 2r.

A potential Vref(i) at the reference circuit input node Rin is determined as shown below:

$$Vref(i)=(Ir+Ic)\times r=(2Is+Ic)\times r=(Is\times 2r)+(Ic\times r)$$

A potential Vsen(i) at the sense amplifier input node Sin is determined as shown below:

$$Vsen(i)=(Is+Ic)\times 2r=(Is\times 2r)+2(Ic\times r)$$

If data is read from the cell TN1 in the state "1", then the current Ic passes through the sense amplifier input node Sin. If data is read from the cell TN1 in the state "0", then no current passes through the sense amplifier input node Sin (Ic=0). Hence, based on the above formula, a potential Vsen(i) at the sense amplifier input node Sin when data is read from the cell TN1 in the state "1" is determined as shown below:

$$Vsen(i)=(Is\times 2r)+2(Ic\times r) \quad (\text{"1" read})$$

The potential Vsen(i) at the sense amplifier input node Sin when data is read from the cell TN1 in the state "0" is determined as shown below:

$$Vsen(i)=Is\times 2r \quad (\text{"0" read})$$

Thus, centering around the potential Vref(i) at the reference circuit input node Rin, a difference, of ±(Ic×r) is generated in the potential Vsen(i) at the sense amplifier input node Sin, depending on whether the cell current Ic passes or not. input voltage of the constant-voltage sense amplifier exhibits linearity with respect to an increase and decrease in cell current.

The reference circuit output voltage Vref is fixed on the basis of the potential Vref(i) at the reference circuit input node Rin and the reference circuit current Ir supplied through the transistors TN41r1 and TN41r2 that are determined by the procedure shown above.

The sense amplifier input node Sin is coupled to the source of the transistor TN41, the gate thereof being subjected to the reference circuit output voltage Vref (constant voltage). The transistor TN41 amplifies the change in the potential Vsen(i) of the sense amplifier input node Sin and outputs to the sense amplifier output node Sout from the drain thereof.

The operating voltage range of the second basic circuit defined by the relationship between a control gate voltage Vcg and the cell current Ic is the same as that of the first basic circuit previously described in conjunction with FIG. 3 and FIG. 4.

SIXTH EMBODIMENT

Figure 13:
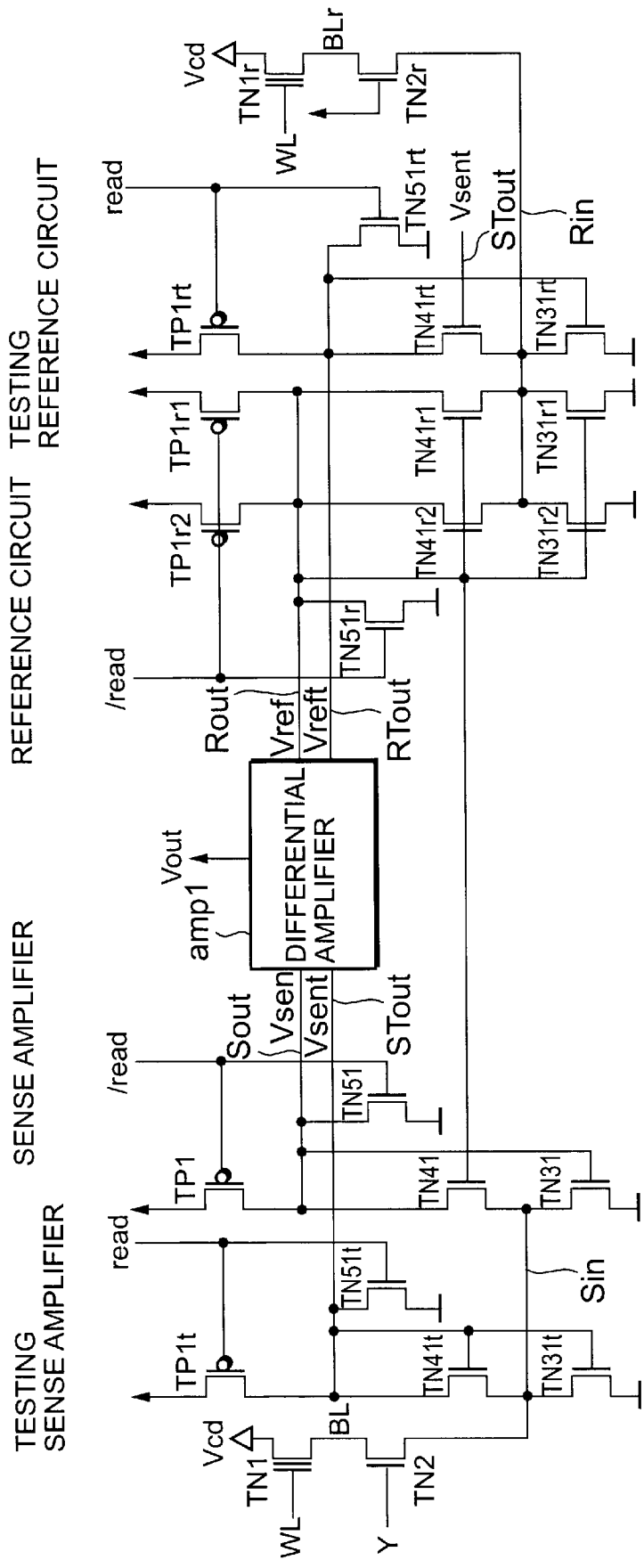
FIG. 13 is a circuit diagram of a testing circuit according to the sixth embodiment of the present invention.

The configuration of a testing circuit according to a sixth embodiment of the present invention is shown in FIG. 13. The testing circuit according to the sixth embodiment is different from the second basic circuit shown in FIG. 12 in that a testing sense amplifier (a second current detecting circuit), a testing reference circuit (a fourth current detecting circuit), and transistors TN51, TN51t, TN51r, and TN51rt for switching between a sense amplifier and a testing sense amplifier and between a reference circuit and a testing reference circuit according as whether the operation is in a normal mode or a test mode have been added. Unlike the second basic circuit provided with the two-input differential amplifier amp, the testing circuit according to the sixth embodiment is provided with a four-input differential amplifier amp1.

The testing sense amplifier is constituted by transistors TP1t, TN31t, and TN41t. The testing reference circuit is constituted by transistors TP1rt, TN31rt, and TN41rt.

A control signal "read" is a mode switching signal that switches to "H" in a normal mode wherein data is read, and to "L" in a test mode. A control signal "/read" is a logic-inverting signal of the control signal "read".

The circuit connections in the testing circuit according to the sixth embodiment that are different from the second basic circuit will be explained.

The gate of a transistor TP1 provided in the sense amplifier is coupled to the transmission line of the control signal "/read" rather than to the ground line.

The drain, the source, and the gate of the added transistor TN51 are coupled to a sense amplifier output node Sout, a ground line, and the transmission line of the control signal "/read".

The gates of transistors TP1r1 and TP1r2 provided in the reference circuit are connected to the transmission line of the control signal "/read" rather than the ground line.

The drain, the source, and the gate of the added transistor TN51r are coupled to a reference circuit output node Rout, a ground line, and the transmission line of the control signal "/read".

The drain, the source, and the gate of the TP1t provided in the testing sense amplifier are coupled to a testing sense amplifier output node STout (a third input node of the differential amplifier), a power-supply voltage Vcc line, and the transmission line of. the control signal "read", respectively. The drain, the source, and the gate of the transistor TN31t are coupled to a sense amplifier input node Sin, a ground line, and a testing sense amplifier output node STout, respectively. The drain, the source, and the gate of the transistor TN41t are coupled to the testing sense amplifier output node STout, the sense amplifier input node Sin, and the testing sense amplifier output node STout, respectively.

The drain, the source, and the gate of the added transistor TN51t are coupled to the testing sense amplifier output node STout, a ground line, and the transmission line of the control signal "read", respectively.

The drain, the source, and the gate of the transistor TP1rt provided in the testing reference circuit are coupled to a testing reference circuit output node RTout (a fourth input node of the differential amplifier), a power-supply voltage Vcc line, and the transmission line of the control signal "read". The drain, the source, and the gate of the transistor TN31rt are coupled to a reference circuit input node Rin, a ground line, and a testing reference circuit output node RTout, respectively. The drain, the source, and the gate of the transistor TN41rt are coupled to the testing reference circuit output node RTout, the reference circuit input node Rin, and the testing sense amplifier output node STout, respectively.

The drain, the source, and the gate of the added transistor TN51rt are coupled to the testing reference circuit output node RTout, a ground line, and the transmission line of the control signal "read", respectively.

Figure 14:
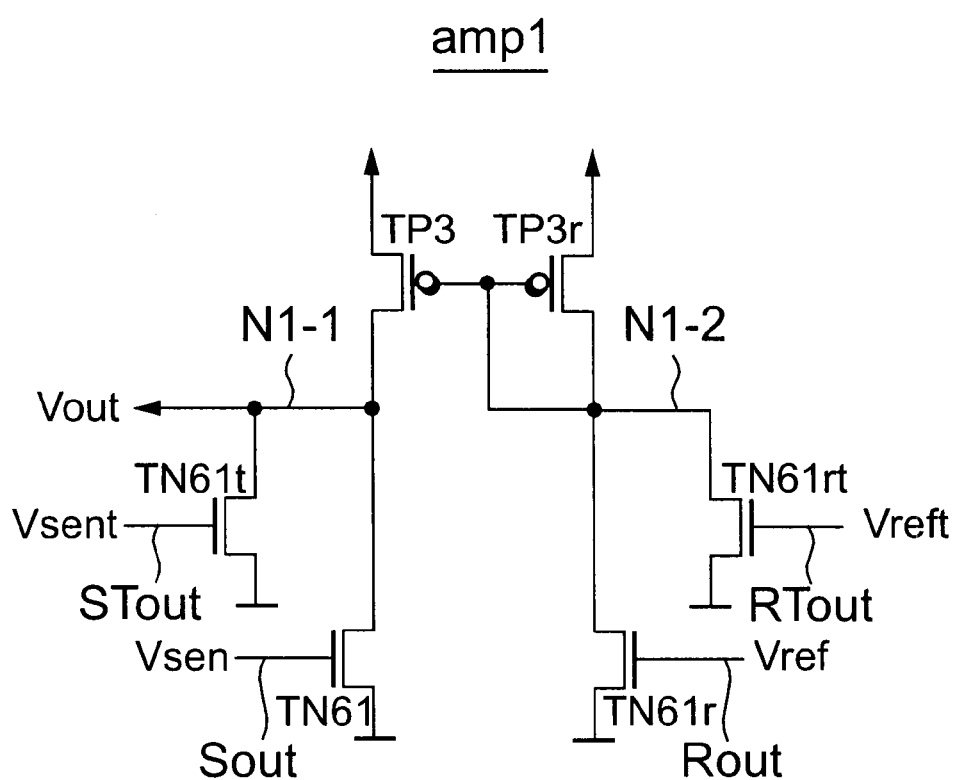
FIG. 14 is a circuit diagram of a differential amplifier provided in the testing circuit shown in FIG. 13.

As shown in FIG. 14, the differential amplifier amp1 is constructed by transistors TP3, TP3r, TN61, TN61t, TN61r, and TN61rt.

The drain, the source, and the gate of the transistor TP3 are coupled to a node N1-1 from which an output voltage Vout is output, a power-supply voltage Vcc line, and a node N1-2, respectively. The drain, the source, and the gate of the transistor TP3r are coupled to the node N1-2, a power-supply voltage Vcc line, and a node N1-2, respectively.

The drain, the source, and the gate of the transistor TN61 are coupled to the node N1-1, a ground line, and the sense amplifier output node Sout, respectively. The drain, the source, and the gate of the transistor TN61t are coupled to the node N1-1, a ground line, and the testing sense amplifier output node STout, respectively. The drain, the source, and the gate of the transistor TN61r are coupled to the node N1-2, a ground line, and the reference circuit output node Rout, respectively. The drain, the source, and the gate of the transistor TN61rt are coupled to the node N1-2, a ground line, and the testing reference circuit output node RTout, respectively.

The operation of the testing circuit according to the sixth embodiment configured as described above will now be explained.

In the normal mode wherein data is read from the cell TN1, the control signal "read" is set at "H", while the control signal "/read" is set at "L"; therefore, the transistors TP1, TP1r1, TP1r2, TN51t, and TN51rt are turned ON, while the transistors TP1t, TP1rt, TN51, and TN51r are turned OFF. Hence, the testing circuit according to the sixth embodiment in the normal mode will be circuit-wise equivalent to the second basic circuit shown in FIG. 12, and perform substantially the same operation as that of the second basic circuit.

In the test mode, the control signal "read" is set at "L", while the control signal "/read" is set at "H"; therefore, the transistors TP1, TP1r1, TP1r2, TN51t, and TN51rt are turned OFF, while the transistors TP1t, TP1rt, TN51, and TN51r are turned ON. This disables the sense amplifier and the reference circuit, while it enables the testing sense amplifier and the testing reference circuit. The sense amplifier output node Sout and the reference circuit output node Rout are set at a ground level by the transistors TN51 and TN51r, so that the transistors TN61 and TN61r provided in the differential amplifier amp1 are turned OFF.

The transistors making up the testing sense amplifier are formed to have ON resistances that are half as high as the ON resistances of the transistors making up the testing reference circuit. To be more specific, each of the transistors constituting the testing sense amplifier is formed so that the gate length thereof coincides with the gate length of the transistor TP1 provided in the sense amplifier and the gate width thereof is double the gate width of the transistor TP1. In addition, each of the transistors constituting the testing reference circuit is formed so that the gate, length and the gate width thereof coincide with the gate length and the gate width of the transistor TN1. Thus, by configuring the sense amplifier, the testing sense amplifier, the reference circuit, and the testing reference circuit, the impedance magnitude relationship between the sense amplifier side (the sense amplifier and the testing sense amplifier) and the reference circuit side (the reference circuit and the testing reference amplifier) is reversed as observed from the differential amplifier amp1, depending on whether the operation mode is the normal mode or the test mode.

As discussed above, the testing circuit according to the sixth embodiment makes it possible to detect a leakage current without the need for writing data to the cell TN1 if the leakage current occurs in the bit line BL.

SEVENTH EMBODIMENT

Figure 15:
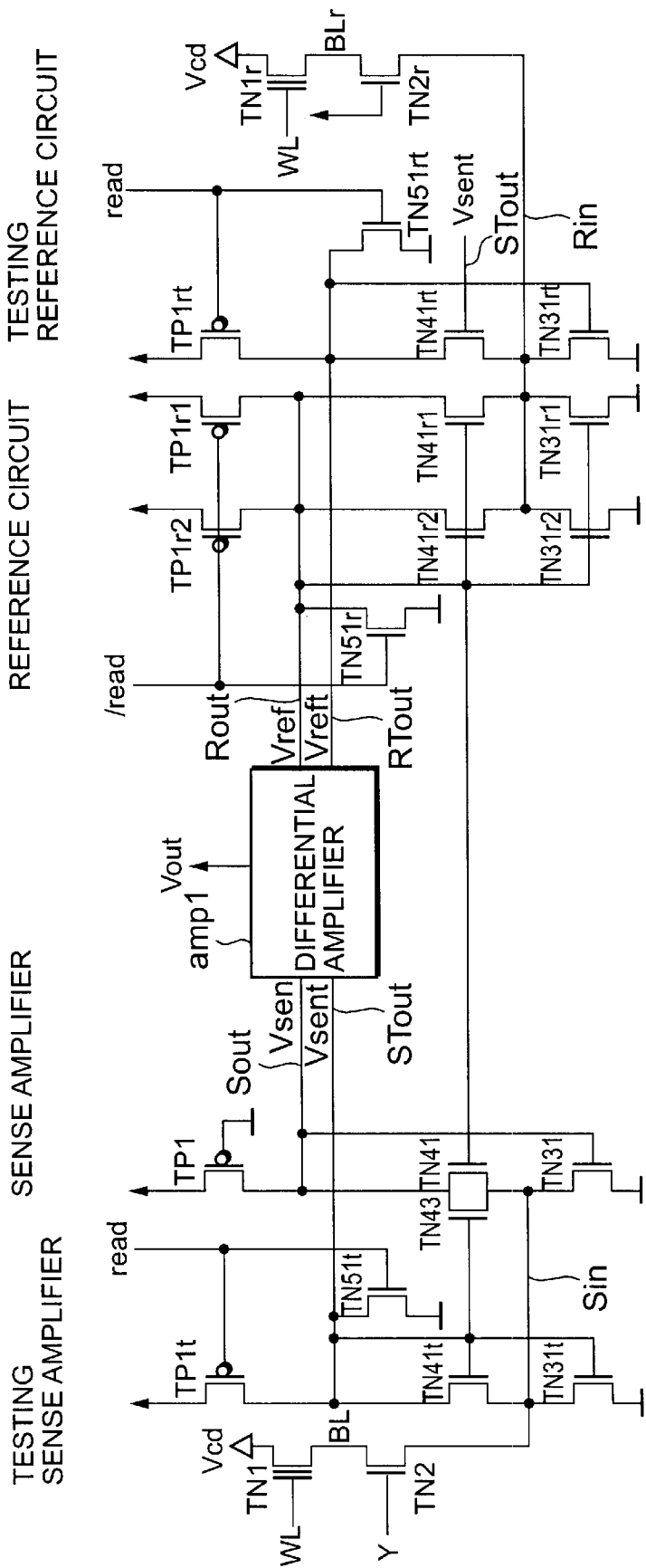
FIG. 15 is a circuit diagram of a testing circuit according to the seventh embodiment of the present invention.

The configuration of a testing circuit according to the seventh embodiment of the present invention is shown in FIG. 15. The testing circuit according to the seventh embodiment is different from the testing circuit according to the sixth embodiment shown in FIG. 13 in that a transistor TN43 has been added, while the transistor TN51 has been removed. Furthermore, the gate of the transistor TP1 is coupled to a ground line rather than the transmission line of a control signal "/read".

The drain, the source, and the gate of the transistor TN43 are coupled to a sense amplifier node Sout, a sense amplifier input node Sin, and a testing sense amplifier output node STout.

Transistors TP1t, TN31t, and TN41t making up the testing sense amplifier are formed to have the same sizes as those of transistors TP1, TN31, and TN41 making up the sense amplifier. The testing circuit according to the seventh embodiment is different from the testing circuit according to the sixth embodiment in that the transistors constituting the testing sense amplifier are formed to have ON resistances that are half as high as the ON resistances of the transistors making up the sense amplifier.

The operation of the testing circuit according to the seventh embodiment configured as described above will now be explained.

In the normal mode wherein data is read from a cell TN1, the control signal "read" is set at "H", while the control signal "/read" is set at "L"; therefore, transistors TP1, TP1r1, TP1r2, TN51t, and TN51rt are turned ON, while the transistors TP1t, TP1rt, and TN51r are turned OFF. Hence, the sense amplifier and the reference circuit are enabled, while the testing sense amplifier and the testing reference circuit are disabled. Furthermore, a testing sense amplifier output node STout and a testing reference circuit output node RTout are set to a ground level by the transistors TN51t and TN51rt, so that transistors TN61t and TN61rt provided in a differential amplifier amp1 are turned OFF. In addition, a testing sense amplifier output node STout is set to a ground level, thus causing the transistor TN43 to turn OFF. Hence, the testing circuit according to the seventh embodiment in the normal mode will be circuit-wise equivalent to the second basic circuit shown in FIG. 12, and perform substantially the same operation as that of the second basic circuit.

In the test mode, the control signal "read" is set at "L", while the control signal "/read" is set at "H"; therefore, transistors TP1r1, TP1r2, TN51t, and TN51rt are turned OFF, while transistors TP1t, TP1rt, and TN51r are turned ON. This disables the reference circuit, while it enables the testing sense amplifier and the testing reference circuit.

A reference circuit output node Rout is set at a ground level by the transistor TN51r, so that the transistor TN41 is turned OFF. However, the transistor TN43 is turned ON because the gate thereof is coupled to the testing sense amplifier output node STout. As a result, the sense amplifier in the test mode is enabled as in the normal mode.

Thus, in the testing circuit according to the seventh embodiment in the test mode, the sense amplifier and the testing sense amplifier are simultaneously enabled at a cell TN1, while only the testing reference circuit is enabled at a reference cell TN1r. As previously mentioned, the transistors making up the testing sense amplifier are formed to have the same sizes as those of the transistors making up a sense amplifier. Similarly, the transistors making up the testing reference circuit are formed to have the same sizes as those of the transistors making up a reference circuit. Hence, the impedance magnitude relationship between the sense amplifier side (the sense amplifier and the testing sense amplifier) and the reference circuit side (the reference circuit and the testing reference amplifier) is reversed as observed from a differential amplifier amp1, depending on whether the operation mode is the normal mode or the test mode.

Thus, as in the case of the testing circuit according to the sixth embodiment, the testing circuit according to the seventh embodiment makes it possible to detect a leakage current without the need for writing data to the cell TN1 if the leakage current occurs in the bit line BL.

EIGHTH EMBODIMENT

Figure 16:
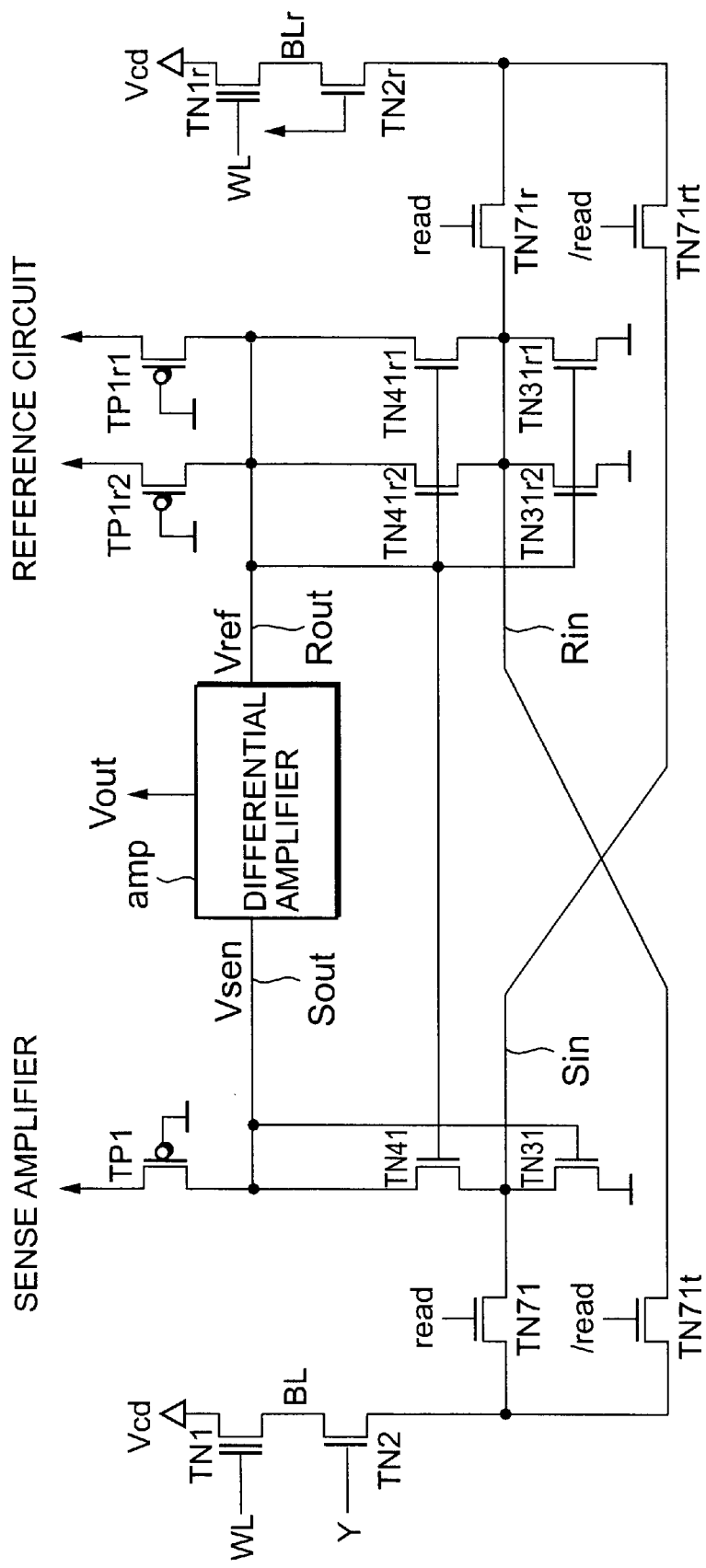
FIG. 16 is a circuit diagram of a testing circuit according to the eighth embodiment of the present invention.

The configuration of a testing circuit according to an eighth embodiment of the present invention is shown in FIG. 16. The testing circuit according to the eighth embodiment is different from the second basic circuit shown in FIG. 12 in that transistors TN71, TN71t, TN71r, and TN71rt have been added.

A control signal "read" is a mode switching signal that switches to "H" in a normal mode wherein data is read, and to "L" in a test mode. A control signal "/read" is a logic-inverting signal of the control signal "read".

The circuit connections in the testing circuit according to the eighth embodiment that are different from the second basic circuit will be explained.

The drain, the source, and the gate of the transistor TN71 are coupled to the source of a transistor TN2 acting as a column switch, a sense amplifier input node Sin, and the transmission line of the control signal "read".

The drain, the source, and the gate of the transistor TN71t are coupled to the source of the transistor TN2, a reference circuit input node Rin, and the transmission line of a control signal "/read".

The drain, the source, and the gate of the transistor TN71r are coupled to the source of a transistor TN2r acting as a dummy column switch, a reference circuit input node Rin, and the transmission line of the control signal "read", respectively.

The drain, the source, and the gate of the transistor TN71rt are coupled to the source of a transistor TN2r acting as a dummy column switch, a sense amplifier input node Sin and the transmission line of the control signal "/read".

The transistors TN71, TN71t, TN71r, and TN71rt are configured so as to have extremely low ON resistances for acting as switches; hence, their influences, such as a voltage drop, on a circuit operation are negligible.

The operation of the testing circuit according to the eighth embodiment constructed as described above will now be explained.

In the normal mode wherein data is read from the cell TN1, the control signal "read" is set at "H", while the control signal "/read" is set at "L"; therefore, the transistors TN71 and TN71r are turned ON, while the transistors TN71t and TN71rt are turned OFF. Hence, the testing circuit according to the eighth embodiment in the normal mode will be circuit-wise equivalent to the second basic circuit shown in FIG. 12, and perform substantially the same operation as that of the second basic circuit.

In the test mode, the control signal "read" is set at "L", while the control signal "/read" is set at "H"; therefore, the transistors TN71 and TN71r are turned OFF, while the transistors TN71t and TN71rt are turned ON. This causes a reference circuit to be coupled to a cell TN1 and a sense amplifier to be connected to the reference cell TN1r in the test mode.

The transistors making up the sense amplifier are formed to have the same sizes as those of the transistors making up the reference circuit. Therefore, the impedance magnitude relationship between a load transistor coupled to the cell TN1 and a load transistor coupled to the reference cell TN1r is switched, depending upon whether the operation is in the normal mode or the test mode.

Thus, as in the case of the testing circuit according to the sixth and seventh embodiments the testing circuit according to the eighth embodiment makes it possible to detect a leakage current without the need for writing data to the cell TN1 if the leakage current occurs in the bit line BL.

NINTH EMBODIMENT

Figure 17:
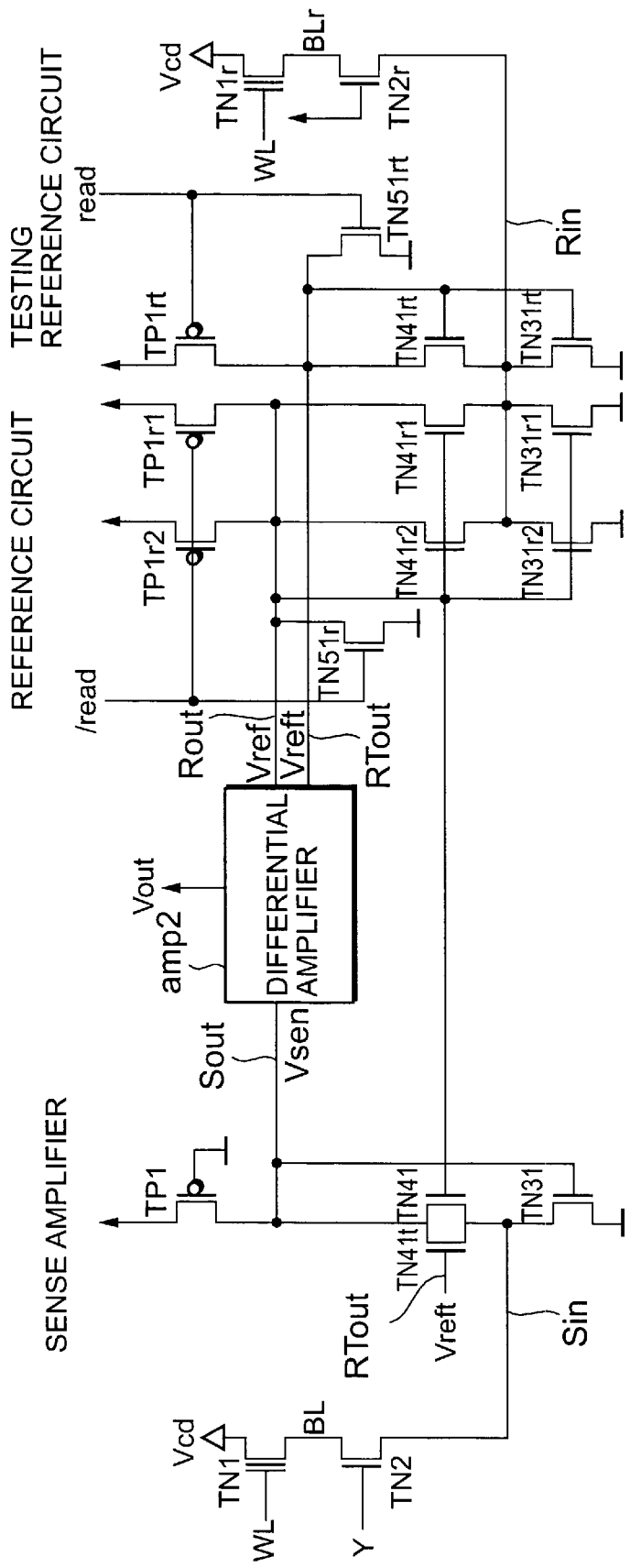
FIG. 17 is a circuit diagram of a testing circuit according to the ninth embodiment of the present invention.

The configuration of a testing circuit according to a ninth embodiment of the present invention is shown in FIG. 17. The testing circuit according to the ninth embodiment is different from the second basic circuit shown in FIG. 12 in that a testing reference circuit has been added, transistors TN51r and TN51rt for switching between a reference circuit and a testing reference circuit, depending upon whether the operation is in a normal mode or a test mode, and a transistor TN41t have been added. Unlike the second basic circuit provided with the two-input differential amplifier amp, the testing circuit according to the ninth embodiment is provided with a three-input differential amplifier amp2.

The testing reference circuit is constituted by transistors TP1rt, TN31rt, and TN41rt. The transistors TP1rt, TN31rt, and TN41rt are formed such that the gate length thereof is equal to the gate length of each of transistors TP1, TN31, and TN41 making up a sense amplifier and the gate width thereof is half that of each of the above transistors. In other words, the ON resistance of each of the TP1rt, TN31rt, and TN41rt is double that of each of the transistors TP1, TN31, and TN41.

A control signal "read" is a mode switching signal that switches to "H" in a normal mode wherein data is read, and to "L" in a test mode. A control signal "/read" is a logic-inverting signal of the control signal "read".

The circuit connections in the testing circuit according to the ninth embodiment that are different from the second basic circuit will be explained.

The drain, the source, and the gate of the transistor TN41t are coupled to a sense amplifier output node Sout, a sense amplifier input node Sin, and a testing reference circuit output node RTout, respectively.

The gates of the transistors TP1r1 and TP1r2 provided in the reference circuit are coupled to the transmission line of the control signal "/read" rather than to the ground line.

The drain, the source, and the gate of the transistor TN51r are coupled to a reference circuit output node Rout, a ground line, and the transmission line of the control signal "/read". The drain, the source, and the gate of the transistor TN51rt are coupled to a testing reference circuit output node RTout, a ground line, and the transmission line of the control signal "read".

The drain, the source, and the gate of the transistor TP1rt provided in the testing reference circuit are coupled to a testing reference circuit output node RTout, a power-supply voltage Vcc line, and the transmission line of the control signal "read", respectively. The drain, the source, and the gate of the transistor TN31rt are coupled to a reference circuit input node Rin, a ground line, and a testing reference circuit output node RTout. The drain, the source, and the gate of the transistor TN41rt are coupled to a testing reference circuit output node RTout, the reference circuit input node Rin, and the testing reference circuit output node RTout.

Figure 18:
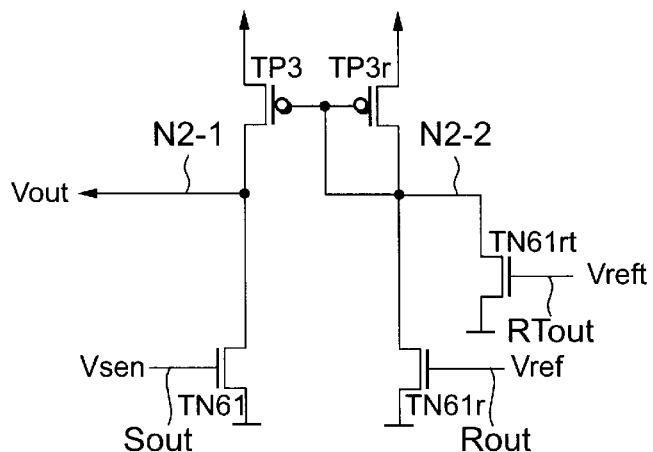
FIG. 18 is a circuit diagram of a differential amplifier provided in the testing circuit shown in FIG. 17.
Figure 19:
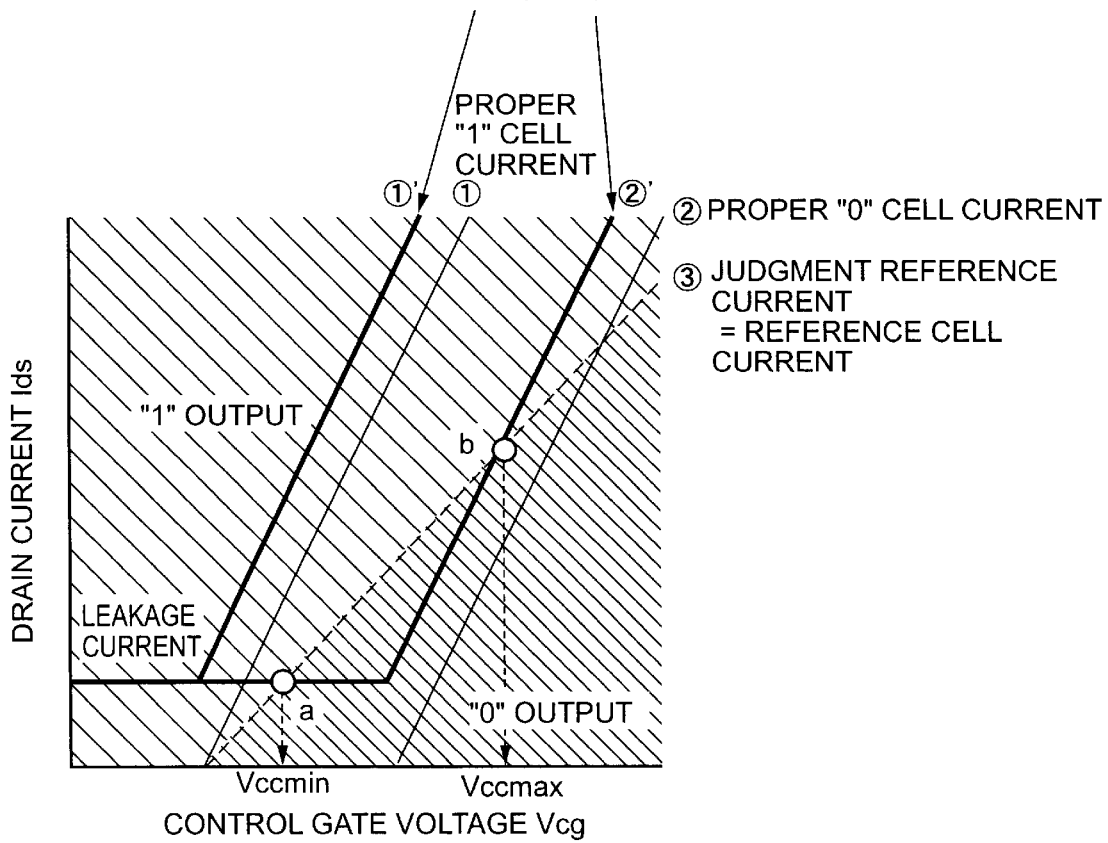
FIG. 19 is a characteristic curve diagram showing the operating voltage range of a data storage memory cell and a reference cell provided in a conventional OTP.

As shown in FIG. 18, the differential amplifier amp2 is constructed by transistors TP3, TP3r, TN61, TN61r, and TN61rt.

The drain, the source, and the gate of the transistor TP3 are coupled to a node N2-1 from which an output voltage Vout is output, a power-supply voltage Vcc line, and a node N2-2, respectively. The drain, the source, and the gate of the transistor TP3r are coupled to the node N2-2, a power-supply voltage Vcc line, and the node N2-2, respectively.

The drain, the source, and the gate of the transistor TN61 are coupled to the node N2-1, a ground line, and the sense amplifier output node Sout, respectively. The drain, the source, and the gate of the transistor TN61r are coupled to the node N2-2, a ground line, and a reference circuit output node Rout, respectively. The drain, the source, and the gate of the transistor TN61rt are coupled to the node N2-2, a ground line, and a testing reference circuit output node RTout, respectively.

The operation of the testing circuit according to the ninth embodiment configured as described above will now be explained.

In the normal mode wherein data is read from the cell TN1, the control signal "read" is set at "H", while the control signal "/read" is set at "L"; therefore, the transistors TP1r1, TP1r2, and TN51rt are turned ON, while the transistors TP1rt and TN51r are turned OFF. The transistor TP1 is always ON. The testing reference circuit output node RTout is set to a ground level by the transistor TN51rt, so that the transistor TN41t wherein the testing reference circuit output node RTout is coupled to the gate thereof is turned OFF. This disables the testing reference circuit, while it enables a sense amplifier and the reference circuit. Hence, the testing circuit according to the ninth embodiment in the normal mode will be circuit-wise equivalent to the second basic circuit shown in FIG. 12, and perform substantially the same operation as that of the second basic circuit.

In the test mode, the control signal "read" is set at "L", while the control signal "/read" is set at "H"; therefore, the transistors TP1r1, TP1r2, and TN51rt are turned OFF, while the transistors TP1rt and TN51r are turned ON. This disables the reference circuit, while it enables the testing reference circuit.

The reference circuit output node Rout is set at a ground level by the transistor TN51r, so that the transistor TN41 is turned OFF. The transistor TN41t is, however, turned ON because the gate thereof is coupled to the testing sense amplifier output node STout. Hence, the sense amplifier in the test mode is enables, as in the normal mode.

As described above, in the testing circuit according to the ninth embodiment in the test mode, the sense amplifier at the cell TN1 side is enabled, and the testing reference circuit at the reference cell TN1r is enabled. As discussed above, the transistors TP1rt, TN31rt, and TN41rt making up the testing reference circuit are formed so that the gate length thereof is equal to the gate length of each of the transistors TP1, TN31, and TN41 making up a sense amplifier and the gate width thereof is half that of each of the above transistors. In other words, the impedance of the testing reference circuit is double the impedance of the sense amplifier. Hence, the impedance magnitude relationship between the sense amplifier side (the sense amplifier and the testing sense amplifier) and the reference circuit side (the reference circuit and the testing reference amplifier) is reversed as observed from the differential amplifier amp2, depending on whether the operation mode is the normal mode or the test mode.

As described above, the testing circuit according to the ninth embodiment makes it possible to detect the current of the reference cell TN1r on the basis of the current passing through the cell TN1. Moreover, as in the case of the testing circuit according to the second embodiment, the configuration of the load transistor on the sense amplifier side remains the same for the normal mode and the test mode, thus allowing the bit lines BL for defects without impairing the sensitivity for detecting a leakage current.

The preferred embodiments have been described with reference to the accompanying drawings; however, the present invention is not limited to the embodiments. Various modifications of the disclosed embodiments will become apparent to persons skilled in the art within the scope of the spirit of the invention upon reference to the description of the invention. It is therefore contemplated that the appended claims will cover any modifications or embodiments as fall within the true scope of the invention.

As described above, according to the present invention, the testing of a current judgment memory cell and the detection of a leakage current from a bit line without writing data .can be simultaneously performed.

What is claimed is:

1. A semiconductor memory circuit comprising:
   a word line;
   a bit line;
   a memory cell transistor having a first terminal applied to a first electrical potential, a second terminal connected to said bit line and a gate connected to said word line;
   a reference bit line;
   a reference cell transistor having a first terminal applied to the first electrical potential, a second terminal connected to said reference bit line and a gate connected to said word line;

a sense node electrically connected to said bit line;

a reference node electrically connected to said reference bit line;

a differential amplifier having a first input connected to said sense node, a second input connected to said reference node and an output;

a first load circuit connected between said sense node and a second potential source, said first load circuit having a first resistance value;

a second load circuit connected between said reference node and the second potential source, said second load circuit having a second resistance value that is lower than the first resistance value; and a test circuit receiving a test signal, said test circuit changing the first and second resistance values in response to the test signal.

2. A semiconductor memory circuit according to claim 1, wherein said bit line is connected to said sense node through a column switch, and wherein said reference bit line is connected to said reference node through the column switch.

3. A semiconductor memory circuit according to claim 1, wherein said bit line is connected to said sense node through a column switch and a first transistor having a gate at which a predetermined electrical potential is applied, and wherein said reference bit line is connected to said reference node through the column switch and a second transistor having a gate at which the predetermined electrical potential is applied.

4. A semiconductor memory circuit according to claim 1, wherein said first load circuit includes a first transistor having a first terminal connected to the second potential source, a second terminal and a gate applied to a predetermined potential, and a second transistor having a first terminal connected to the second terminal of the first transistor, a second terminal and a gate connected to the second terminal thereof and the sense node.

5. A semiconductor memory circuit according to claim 1, wherein said second load circuit includes a first transistor having a first terminal connected to the second potential source, a second terminal and a gate applied to a predetermined potential, a second transistor having a first terminal connected to the second terminal of the first transistor, a second terminal and a gate connected to the second terminal thereof and the reference node, and a third transistor having a first terminal, a second terminal and a gate connected to the second terminal thereof and the reference node.

6. A semiconductor memory circuit according to claim 5, wherein said test circuit includes a fourth transistor having a first terminal connected to the second potential source, a second terminal and a gate receiving the test signal, a fifth transistor having a first terminal connected to the second terminal of the first transistor, a second terminal and a gate connected to the second terminal thereof and the reference node, and a sixth transistor having a first terminal connected to the second potential source, a second terminal connected to the first terminal of the third transistor and a gate receiving an inversion signal of the test signal.

7. A semiconductor memory circuit according to claim 1, wherein said second load circuit includes a first transistor having a first terminal, a second terminal and a gate connected to the second terminal thereof and the reference node, a second transistor having a first terminal, a second terminal and a gate connected to the second terminal thereof and the reference node, and a third transistor having a first terminal, a second terminal and a gate connected to the second terminal thereof and the reference node.

8. A semiconductor memory circuit according to claim 7, wherein said test circuit includes a fourth transistor having a first terminal connected to the second potential source, a second terminal connected to the first terminal of the first transistor and a gate receiving the test signal, a fifth transistor having a first terminal connected to the second potential source, a second terminal connected to the first terminal of the second transistor and a gate receiving an inversion signal of the test signal, and a sixth transistor having a first terminal connected to the second potential source, a second terminal connected to the first terminal of the third transistor and a gate receiving the inversion signal.

9. A semiconductor memory circuit according to claim 1, wherein said first load circuit includes a first transistor having a first terminal, a second terminal and a gate connected to the second terminal thereof and the sense node, and a second transistor having a first terminal, a second terminal and a gate connected to the second terminal thereof and the sense node.

10. A semiconductor memory circuit according to claim 9, wherein said test circuit includes a third transistor having a first terminal connected to the second potential source, a second terminal connected to the first terminal of the first transistor and a gate receiving the test signal, and a fourth transistor having a first terminal connected to the second potential source, a second terminal connected to the first terminal of the second transistor and a gate receiving an inversion signal of the test signal.

11. A semiconductor memory circuit according to claim 1, wherein said second load circuit includes a first transistor having a first terminal, a second terminal connected to the sense node and a gate connected to the reference node, a second transistor having a first terminal, a second terminal and a gate connected to the second terminal thereof and the reference node, and a third transistor having a first terminal, a second terminal and a gate connected to the second terminal thereof and the reference node.

12. A semiconductor memory circuit according to claim 11, wherein said test circuit includes a fourth transistor having a first terminal connected to the second potential source, a second terminal connected to the first terminal of the first transistor and a gate receiving the test signal, a fifth transistor having a first terminal connected to the second potential source, a second terminal connected to the first terminal of the second transistor and a gate receiving an inversion signal of the test signal, and a sixth transistor having a first terminal connected to the second potential source, a second terminal connected to the first terminal of the third transistor and a gate receiving the inversion signal.

13. A semiconductor memory circuit comprising:

a word line;

a bit line;

a memory cell transistor having a first terminal applied to a first electrical potential, a second terminal connected to said bit line and a gate connected to said word line;

a reference bit line;

a reference cell transistor having a first terminal applied to the first electrical potential, a second terminal connected to said reference bit line and a gate connected to said word line;

a sense node;

a reference node;

a differential amplifier having a first input connected to said sense node, a second input connected to said reference node and an output;

a first load circuit connected between said sense node and a second potential source, said first load circuit having a first resistance value;

a second load circuit connected between said reference node and the second potential source, said second load circuit having a second resistance value that is lower than the first resistance value; and a test circuit connected to said sense node, said reference node, said bit line and said reference bit line, said test circuit connecting said bit line with said sense node and said reference bit line with said reference node when a test signal is in an inactivation level, said test circuit connecting said bit line with said reference node and said reference bit line with said sense node when a test signal is in an activate level.

14. A semiconductor memory circuit according to claim 13, wherein said bit line is connected to said test circuit through a column switch, and wherein said reference bit line is connected to said test circuit through the column switch.

15. A semiconductor memory circuit according to claim 13, wherein said sense node is connected to said test circuit through a first transistor having a gate at which a predetermined electrical potential is applied, and wherein said reference node is connected to said test circuit through a second transistor having a gate at which the predetermined electrical potential is applied.

16. A semiconductor memory circuit according to claim 13, wherein said first load circuit includes a first transistor having a first terminal connected to the second potential source, a second terminal and a gate connected to the second terminal thereof and the sense node.

17. A semiconductor memory circuit according to claim 13, wherein said second load circuit includes a first transistor having a first terminal connected to the second potential source, a second terminal and a gate connected to the second terminal thereof and the reference node, and a second transistor having a first terminal connected to the second potential source, a second terminal and a gate connected to the second terminal thereof and the reference node.

18. A semiconductor memory circuit comprising:

a word line;

a bit line;

a memory cell transistor having a first terminal applied to a first electrical potential, a second terminal connected to said bit line and a gate connected to said word line;

a reference bit line;

a reference cell transistor having a first terminal applied to the first electrical potential, a second terminal connected to said reference bit line and a gate connected to said word line;

a sense node electrically connected to said bit line;

a reference node electrically connected to said reference bit line;

a differential amplifier having a first input connected to said sense node, a second input connected to said reference node and an output;

a first load circuit connected between said sense node and a second potential source, said first load circuit having a first resistance value when a test signal has an inactive level, said first load circuit having a second resistance value when the test signal has an active level; and a second load circuit connected between said reference node and the second potential source, said second load circuit having a third resistance value that is lower than the first resistance value when the test signal has the inactive level, said second load circuit having a fourth resistance value that is substantially equal to or higher than the second resistance value when the test signal has the active level.

19. A semiconductor memory circuit according to claim 18, wherein said bit line is connected to said sense node through a column switch, and wherein said reference bit line is connected to said reference node through the column switch.

20. A semiconductor memory circuit according to claim 18, wherein said bit line is connected to said sense node through a column switch and a first transistor having a gate at which a predetermined electrical potential is applied, and wherein said reference bit line is connected to said reference node through the column switch and a second transistor having a gate at which the predetermined electrical potential is applied.

* * * * *